United States Patent [19]
Goto

[11] Patent Number: 5,729,139
[45] Date of Patent: Mar. 17, 1998

[54] MRI APPARATUS

[75] Inventor: Takao Goto, Tokyo, Japan

[73] Assignee: GE Yokogawa Medical Systems, Ltd., Tokyo, Japan

[21] Appl. No.: 603,672

[22] Filed: Feb. 20, 1996

[30] Foreign Application Priority Data

Mar. 28, 1995 [JP] Japan ................................. 7-069082
Sep. 21, 1995 [JP] Japan ................................. 7-242857

[51] Int. Cl.$^6$ .................................................. G01V 3/00
[52] U.S. Cl. ................................... 324/309; 324/307
[58] Field of Search ................................ 324/309, 307, 324/306, 314, 312, 300

[56] References Cited

U.S. PATENT DOCUMENTS

| | | | |
|---|---|---|---|
| 5,450,010 | 9/1995 | Van Der Meulen et al. | 324/309 |
| 5,455,512 | 10/1995 | Groen et al. | 324/309 |
| 5,488,298 | 1/1996 | Wright et al. | 324/309 |
| 5,508,612 | 4/1996 | Kanazawa | 324/309 |

FOREIGN PATENT DOCUMENTS

| | | |
|---|---|---|
| 210562 | 4/1987 | European Pat. Off. |
| 492706 | 1/1992 | European Pat. Off. |
| 595391 | 4/1994 | European Pat. Off. |
| 6245917 | 6/1994 | Japan |

Primary Examiner—Louis M. Arana
Attorney, Agent, or Firm—Moonray Kojima

[57] ABSTRACT

The present invention relates to an MRI apparatus capable of preventing the quality of an image from being degraded under the influence of eddy currents and residual magnetization caused by a phase encode gradient. While an RF pulse P1 is sent, a phase encode gradient gy(i) is applied to a warp axis and a read gradient rr is applied to a read axis, an NMR signal is received, followed by application of a rewind gradient gyr(i)' to the warp axis. The rewind gradient gyr(i)' is defined as "(a basic component of opposite polarity equal in time integral value to the phase encode gradient gy(i))+(a warp-axis correction component for correcting the influence of eddy currents or residual magnetization caused by the phase encode gradient gy(i))".

10 Claims, 25 Drawing Sheets

RF pulse warp axis read axis echo

RF pulse slice axis read axis echo

MRI APPARATUS

BACKGROUND OF THE INVENTION

1. Field of the Invention

The present invention relates to an MRI (Magnetic Resonance Imaging) apparatus, and more particularly to an MRI apparatus capable of preventing the quality of an image from being degraded by eddy currents and residual magnetization caused by a phase encode gradient.

2. Description of the Related Art

FIG. 1 shows a pulse sequence employed in a conventional high-speed SE (Spin Echo) method.

In the pulse sequence Kp, an excitation pulse R and a slice gradient ss are applied. Next, a first inversion or reversal pulse P1 and a slice gradient ss are applied and a phase encode gradient gy(i) is applied to a warp axis. Further, an NMR signal is received from a first echo SE1 while a read gradient rr is being applied to a read axis. Thereafter, a rewind gradient gyr(i) of opposite polarity, which is equal in time integral value to the phase encode gradient gy(i), is applied to the warp axis. Next, a second inversion pulse P2 and a slice gradient ss are applied and an encode gradient gy(i+1) is applied to the warp axis. Further, an NMR signal is received from a second echo SE2 while a read gradient rr is being applied. Thereafter, a rewind gradient gyr(i+1) of opposite polarity, which is identical in time integral value to the encode gradient gy(i+1), is applied to the warp axis. Next, a third inversion pulse P3 and a slice gradient ss are applied and an encode gradient gy(i+2) is applied to the warp axis. Further, an NMR signal is received from a third echo SE3 while a read gradient rr is being applied. Thereafter, a rewind gradient gyr(i+2) of opposite polarity, which is equal in time integral value to the encode gradient gy (i+2), is applied to the warp axis. Thus, a killer gradient Kil is applied after a process from the transmission of the inversion pulse to the reception of the NMR signal has been repeated M times. This process is hereafter repeated N times in a repetitive time TR so that NMR signals subjected to different phase encodings corresponding to (M×N) times are collected on the warp axis.

Incidentally, p=1, 2, . . . , N. Further, M=3 in FIG. 1. However, M≧4 is normally often used to shorten a scan time. Furthermore, i=(p−1)M+1, and the terms (i), (i+1)and (i+2)in the encode gradients gy(i), gy (i+1) and gy (i+2) indicate phase encode numbers, respectively.

The killer gradient Kil shows a gradient pulse for spoiling transverse magnetization. The polarity of the killer gradient Kil is conventionally kept constant.

FIG. 2 shows a locus of collection of data on k-space in the aforementioned pulse sequence Kp.

In the case of an echo row at M=3, the k-space Ksp is divided into three segments Sg1, Sg2 and Sg3. Data (e.g., tc1) about the first segment Sg1 is collected by a first echo SE1, data (e.g., tc2) about the second segment sg2 is collected by a second echo SE2. Further, data (e.g., tc3) about the third segment Sg3 is collected by a third echo SE3.

FIG. 2 shows p=1Positions of data on a phase axis are determined by phase encode gradients gy(1), gy(2) and gy(3), respectively. The quantity of phase encoding is returned to "0" by rewind gradients gyr(1), gyr(2) and gyr(3).

Since the contrast of an image is decided by data close to the phase encode quantity of "0", a time interval TEeff that elapsed before the second echo SE2 shown in FIG. 1, becomes an effective echo time.

FIG. 3 illustrates a pulse sequence employed in a conventional 3D (three-dimensional) high-speed SE method.

In the pulse sequence Kp', an excitation pulse R and a slice gradient ss are applied. Next, a rewind gradient gzr(0) of opposite polarity, which is equal in time integral value to a phase encode gradient applied to a slice axis immediately before the application of the excitation pulse R and the slice gradient ss, is applied to the slice axis so as to be superimposed on a crusher gradient. Further, a first inversion or reversal pulse P1 and a slice gradient are applied and a phase encode gradient gz(i) is applied to the slice axis so as to be superimposed on a crusher gradient. A phase encode gradient gy(i) is applied to a warp axis. Next, an NMR signal is received from a first echo SE1 while a read gradient rr is being applied. Thereafter, a rewind gradient gyr(i) of opposite polarity, which is equal in time integral value to the encode gradient gy(i) applied to the warp axis, is applied to the warp axis and a rewind gradient gzr(i) of opposite polarity, which is equal in time integral value to the phase encode gradient gz(i) applied to the slice axis, is applied to the slice axis so as to be superimposed on a crusher gradient. Next, a second inversion pulse P2 and a slice gradient are applied and a phase encode gradient gz(i+1) is applied to the slice axis so as to be superposed on a crusher gradient. Further, a phase encode gradient gy(i+1) is applied to the warp axis. Next, an NMR signal is received from a second echo SE2 while a read gradient rr is being applied. Thereafter, a rewind gradient gyr(i+1) of opposite polarity, which is equal in time integral value to the phase encode gradient gy(i+1) applied to the warp axis, is applied to the warp axis. A rewind gradient gyr(i+1) of opposite polarity, which is identical in time integral value to the phase encode gradient gz(i+1) applied to the slice axis, is applied to the warp axis so as to be superimposed on a crusher gradient. Next, a third inversion or reversal pulse P3 and a slice gradient are applied and a phase encode gradient gz(i+2) is applied to the slice axis so as to be superimposed on a crusher gradient. Further, a phase encode gradient gy(i+2) is applied to the warp axis. Next, an NMR signal is received from a third echo SE3 while a read gradient rr is being applied. Thereafter, a rewind gradient gyr(i+2) of opposite polarity, which is identical in time integral value to the phase encode gradient gy(i+2) applied to the warp axis, is applied to the warp axis. Thus, a killer gradient Kil is applied after a process from the transmission of the inversion pulse P to the reception of the NMR signal has been repeated M times (M=3 in the present pulse sequence). This process is repeated in a repetitive time TR so that phase-encoded NMR signals are collected on the slice axis and the warp axis.

According to the high-speed SE methods using the pulse sequences Kp and Kp' shown in FIGS. 1 and 3, the amplitudes of the phase encode gradients gy(i), gy(i+1) and gy(i+2) applied to the warp axis are set as large as possible and each time width tgy is shortened in unison with the amplitude. According to the 3D high-speed SE method using the pulse sequence Kp' shown in FIG. 3, the amplitudes of the phase encode gradients gz(i), gz(i+1) and gz(i+2) applied to the slice axis are set as large as possible and each time width tgz is shortened correspondingly.

However, eddy currents are produced as the amplitude of the gradient pulse increases and the time width is shortened. Further, residual magnetization occurs as the amplitude of the pulse increases. If eddy currents and residual magnetization are produced, an artifact occurs on an image due to their influence so that the quality of the image is degraded.

Particularly, an MRI apparatus using a permanent magnet has a problem in that the quality of an image is degraded due to residual magnetization developed in a magnetic shunt plate.

On the other hand, according to Japanese Patent Application Laid-Open No. 6-245917, for example, there has been proposed a technique for canceling the influence of residual magnetization by applying an offset slope or gradient and a technique for correcting a shift in phase due to residual magnetization of the magnetic shunt plate by computation.

The effect or influence of residual magnetization caused by a phase encode gradient becomes pronounced particularly when the sequence employed in the high-speed SE method is executed by the MRI apparatus using the permanent magnet.

This will be described with reference to FIGS. 4 and 5.

As shown in FIG. 4, the residual magnetization having a strength $\Delta GY$ takes place due to a phase encode gradient $gy(i)$ applied to a warp axis. The residual magnetization causes a first echo SE1 to produces a phase shift. Phase shifts occur in a second echo SE2, a third echo SE3, ... in the same manner as described above.

The quantity of phase encoding cannot be returned to "0" due to a rewind gradient $gyr(i)$. Hence this will exert an influence on the phases of the second and third echoes SE2 and SE3. The phase encode quantity cannot be returned to "0" in a manner similar to a rewind gradient $gyr(i+1)$, a rewind gradient $gyr(i+2)$, ... either. Hence this will exert an influence on the phases of the subsequent echoes.

It is further necessary to match the phase of a stimulated echo STE (which is an abbreviation of STimulated Echo) produced simultaneously with a spin echo with that of the spin echo. However, these phases do not match each other. The second echo SE2 which is important in deciding the contrast of an image and a second stimulated echo STE2 produced simultaneously with the second echo SE2 are illustrated in FIG. 4. However, the second echo SE2 is phase-shifted under the influence of the residual magnetization of the strength $\Delta GY(i)$ by the phase encode gradient $gy(i)$. Since the second stimulated echo STE2 is not affected by the residual magnetization on the other hand (an interval between a first inversion or reversal pulse P1 and a second inversion pulse P2 becomes longitudinal magnetization), the phase of the second echo SE2 does not match that of the second stimulated echo STE2. As a result, interference is produced between the two and hence a Ghost Artifact, a Shading Artifact and a Ringing Artifact appear on the image.

As shown in FIG. 5, the residual magnetization having a strength $\Delta GZ(i)$ is produced by a phase encode gradient $gz(i)$ applied to a slice axis. The residual magnetization causes a first echo SE1 to produce a phase shift. Phase shifts occur in a second echo SE2, a third echo SE3, ... in the same manner as described above.

Further, the quantity of phase encoding cannot be returned to "0" due to a rewind gradient $gzr(i)$. This will exert an influence on the phases of the second and third echoes SE2 and SE3. The phase encode quantity cannot be returned to "0" in a manner similar to a rewind gradient $gzr(i+1)$, a rewind gradient $gyr(i+2)$, ... either. Hence, this will exert an influence on the phases of the subsequent echoes.

Furthermore, the phase of the second echo SE2 which is important indeciding the contrast of an image, does not match that of a second stimulated echo STE2 produced simultaneously with the second echo SE2, whereby an artifact occurs on the image.

However, the conventional techniques proposed in Japanese Patent Application Laid-Open No. 6-245917 referred to above has a problem in that they are insufficient to prevent the quality of an image from being degraded by eddy currents and residual magnetization caused by a phase encode gradient.

SUMMARY OF THE INVENTION

With the foregoing in view, it is therefore an object of the present invention to provide an MRI apparatus capable of preventing the quality of an image from being degraded by eddy currents and residual magnetization caused by a phase encode gradient.

In a first aspect of the present invention, there is provided an MRI apparatus including an RF pulse transmitting means, a gradient magnetic field applying means and an NMR signal receiving means. In the MRI apparatus, an RF pulse is transmitted from the RF pulse transmitting means and a phase encode gradient is applied to a warp axis by the gradient magnetic field applying means. Further, an NMR signal is received by the NMR signal receiving means. Thereafter, a rewind gradient obtained by adding a warp-axis correction component for correcting the influence of eddy currents or residual magnetization caused by the phase encode gradient to a basic component of opposite polarity equal in time integral value to the phase encode gradient is applied to the warp axis by the gradient magnetic field applying means. Alternatively, a rewind gradient equivalent to the basic component and an auxiliary rewind gradient equivalent to the warp-axis correction component are applied to the warp axis. Upon the aforementioned "addition", they may be added together as either the amplitudes or time widths. Alternatively, they may be added together as both of the amplitudes and time widths.

In the MRI apparatus according to the first aspect of the present invention, the rewind gradient composed of "(the basic component of opposite polarity equal in time integral time to the phase encode gradient)+(the warp-axis correction component for correcting the influence of the eddy currents or residual magnetization caused by the phase encode gradient)" is applied to the warp axis. Alternatively, the rewind gradient composed of (the basic component of opposite polarity equal in time integral value to the phase encode gradient) and the auxiliary rewind gradient composed of (the warp-axis correction component for correcting the influence of the eddy currents or residual magnetization caused by the phase encode gradient) are applied to the warp axis.

The quantity of phase encoding is returned to "0" (original rewind) based on the basic component so that the influence of the eddy currents or residual magnetization caused by the phase encode gradient is canceled by the warp-axis correction component. It is therefore possible to prevent the quality of an image from being degraded the influence of the eddy currents or residual magnetization caused by the phase encode gradient.

In a second aspect of the present invention as well, there is provided an MRI apparatus including an RF pulse transmitting means, a gradient magnetic field applying means and an NMR signal receiving means. In the MRI apparatus, an RF pulse is transmitted from the RF pulse transmitting means. A phase encode gradient obtained by adding a warp-axis correction component for correcting the influence of eddy currents or residual magnetization caused by a phase encode gradient applied to a warp axis to a basic component of the phase encode gradient on the warp axis, which is determined by a scan parameter, is applied to the warp axis. Alternatively, a phase encode gradient equivalent to the basic component and an auxiliary phase encode gradient equivalent to the warp-axis correction component are applied to the warp axis. After an NMR signal has been received by the NMR signal receiving means, a rewind gradient of opposite polarity, which is equal in time integral value to the basic component of the phase encode gradient, is applied to the warp axis. The aforementioned "addition", may be added together as the amplitudes or time widths. Alternatively, they may be added together as both amplitudes and time widths.

In the MRI apparatus according to the aforementioned second aspect of the present invention, the phase encode gradient composed of "(the basic component of the phase encode gradient decided by the scan parameter) +(the warp-axis correction component for correcting the influence of the eddy currents or residual magnetization caused by the phase encode gradient)" is applied to the warp axis. As an alternative, the phase encode gradient composed of (the basic component of the phase encode gradient decided by the scan parameter) and the auxiliary phase encode gradient composed of (the warp-axis correction component for correcting the influence of the eddy currents or residual magnetization caused by the phase encode gradient) are applied to the warp axis.

The phase encode (i.e. original phase encode) is effected based on the basic component so that the influence of the eddy currents or residual magnetization caused by the phase encode gradient is canceled by the warp-axis correction component. Therefore, the quality of an image can be prevented from being degraded by of the eddy currents or residual magnetization caused by the phase encode gradient.

In a third aspect of the present invention, there is provided the MRI apparatus having the above construction, which further includes a first phase information acquiring means for receiving an NMR signal through the NMR signal receiving means while the RF pulse transmitting means transmits an RF pulse and the gradient magnetic field applying means applies a read gradient to a read axis without applying the phase encode gradient to the warp axis and thereby obtaining first phase information from the received NMR signal, a second phase information acquiring means for receiving an NMR signal through the NMR signal receiving means while the RF pulse transmitting means transmits an RF pulse, the gradient magnetic field applying means applies an equivalent phase encode gradient equal in time integral value to the phase encode gradient to the read axis, applies an equivalent rewind gradient of opposite polarity equal in time integral value to the equivalent phase encode gradient to the read axis without applying the phase encode gradient to the warp axis, and then applies a read gradient to the read axis and thereby obtaining second phase information from the received NMR signal, and a warp-axis correction component calculating means for determining the warp-axis correction component from the first phase information and the second phase information.

In the MRI apparatus according to the aforementioned third aspect of the present invention, the warp-axis correction component is determined as follows:

(1) The NMR signal is received while the RF pulse is transmitted and the read gradient is applied to the read axis without applying the phase encode gradient to the warp axis, thereby to obtain the first phase information from the received NMR signal.

(2) The NMR signal is received while the RF pulse is transmitted, the equivalent phase encode gradient equal in time integral value to the phase encode gradient is applied to the read axis and the equivalent rewind gradient of opposite polarity equal in time integral value to the equivalent phase encode gradient is applied to the read axis without applying the phase encode gradient to the warp axis, thereby to obtain the second phase information from the received NMR signal.

(3) The warp-axis correction component is determined from the first phase information and the second phase information.

The first phase information is equivalent to phase information, which is not influenced by the eddy currents or residual magnetization caused by the phase encode gradient. Further, the second phase information corresponds to phase information at the time that the influence of the eddy currents or residual magnetization caused by the phase encode gradient is equivalently exerted on the read axis. Thus, if the first phase information is compared with the second phase information, the influence of the eddy currents or residual magnetization caused by the phase encode gradient can be quantitatively recognized. Accordingly, the warp-axis correction component for canceling the influence can be quantitatively determined.

In a fourth aspect of the present invention, there is provided the MRI apparatus having the above construction, which further includes a present-existing phase information acquiring means for receiving an NMR signal through the NMR signal receiving means while the RF pulse transmitting means transmits an RF pulse and the gradient magnetic field applying means applies a phase encode gradient to a warp axis and then applies a read gradient to a read axis and thereby obtaining present-existing phase information from the received NMR signal, an ideal phase information acquiring means for receiving an NMR signal through the NMR signal receiving means while the RF pulse transmitting means transmits an RF pulse and the gradient magnetic field applying means applies a phase encode gradient whose time width and amplitude have been enlarged and reduced respectively, to the warp axis and then applies a read gradient to a read axis and thereby obtaining ideal phase information from the received NMR signal, and a warp-axis correction component calculating means for determining the warp-axis correction component from the present-existing phase information and the ideal phase information.

In the MRI apparatus according to the aforementioned fourth aspect of the present invention, the warp-axis correction component is determined as follows:

(1) The NMR signal is received while the RF pulse is transmitted, the phase encode gradient is applied to the warp axis and the read gradient is applied to the read axis, thereby to acquire the present-existing phase information from the received NMR signal.

(2) The NMR signal is received while the RF pulse is transmitted, the phase encode gradient whose time width and amplitude are enlarged and reduced respectively, is applied to the warp axis and the read gradient is applied to the read axis, thereby to obtain the ideal phase information from the received NMR signal.

(3) The warp-axis correction component is determined from the present-existing phase information and the ideal phase information.

The present-existing phase information corresponds to phase information including the influence of eddy currents or residual magnetization caused by the phase encode gradient. Further, the ideal phase information is equivalent to phase information which does not include the influence of the eddy currents or residual magnetization caused by the phase encode gradient. Thus, if the present-existing phase information is compared with the ideal phase information, the influence of the eddy currents or residual magnetization caused by the phase encode gradient can be quantitatively recognized. It is therefore possible to quantitatively determine the warp-axis correction component for canceling the influence.

In a the fifth aspect of the present invention, there is provided an MRI apparatus, wherein an NMR signal receiving means receives an NMR signal therein while an RF pulse transmitting means transmits an excitation RF pulse and an inversion RF pulse and a gradient magnetic field applying means applies a phase encode gradient to a warp axis and then applies a read gradient to a read axis, the gradient magnetic field applying means applies a killer gradient after a process from the transmission of the inversion RF pulse to the reception of the NMR signal has been repeated M times, and a process from the transmission of the excitation RF pulse to the application of the killer gradient is repeated N times thereby to collect NMR signals phase-encoded (M×N) times on a different basis. In the MRI apparatus, the gradient magnetic field applying means switches the polarity of the killer gradient to the same polarity as that of the sum of phase encode gradients per M times, which are applied when the process from the transmission of the inversion RF pulse to the reception of the NMR signal is repeated M times.

In the MRI apparatus according to the aforementioned fifth aspect of the present invention, the polarity of the killer gradient is switched so as to become the same polarity as that of the sum of phase encode gradients per plural times, which are applied in the corresponding pulse train.

conventionally, since the polarity of the killer gradient is constant, the killer gradient merely functioned as a spoiler. However, when the polarity of the killer gradient is switched to the same polarity as that of the sum of the phase encode gradients per plural times, which have been applied in the corresponding pulse train, the result is to cancel the influence of eddy currents or residual magnetization caused by each phase encode gradient. Therefore, the quality of an image can be prevented from being degraded by the eddy currents or residual magnetization caused by the phase encode gradient.

In a sixth aspect of the present invention, there is provided an MRI apparatus, wherein while an RF pulse transmitting means transmits an excitation RF pulse and an inversion RF pulse therefrom and a gradient magnetic field applying means next applies a phase encode gradient to a warp axis or applies it to the warp axis and a slice axis and thereafter applies a read gradient to a read axis, an NMR signal receiving means receives an NMR signal therein. In the MRI apparatus, a transmission phase of the inversion RF pulse transmitted from the RF pulse transmitting means is changed or a phase detected by the NMR signal receiving means is changed so as to suppress a 0-order phase component produced by residual magnetization caused by the phase encode gradient.

The effect or influence of the residual magnetization caused by the phase encode gradient includes a 0-order phase component uniformly added without depending on the position and a first-order phase component linearly varied depending on the position. The 0-order phase component mainly produces a Ghost Artifact whereas the first-order phase component mainly produces a Shading Artifact.

Since the 0-order phase component is developed as an overall phase shift of the NMR signal, the 0-order phase component can be returned to the original state by changing the transmission phase of the inversion RF pulse transmitted from the RF pulse transmitting means or by changing the phase detected by the NMR signal receiving means. Therefore, the Ghost Artifact can be suppressed.

In a seventh aspect of the present invention, there is provided the MRI apparatus having the aforementioned construction, which includes a 0-order phase component acquiring means for receiving an NMR signal through the NMR signal receiving means while the RF pulse transmitting means transmits an RF pulse, the gradient magnetic field applying means applies an equivalent phase encode gradient equal in time integral value to the phase encode gradient to the read axis and applies an equivalent rewind gradient of opposite polarity equal in time integral value to the equivalent phase encode gradient to the read axis without applying the phase encode gradient to the warp axis and the slice axis, and the gradient magnetic field applying means next applies a read gradient to the read axis, obtaining phase information from the received NMR signal and determining the 0-order phase component from the so-obtained phase information.

In the MRI apparatus according to the aforementioned seventh aspect of the present invention, the 0-order phase component is determined as follows:

(1) The NMR signal is received while the RF pulse is transmitted, the equivalent phase encode gradient equal in time integral value to the phase encode gradient is applied to the read axis and the equivalent rewind gradient of opposite polarity equal in time integral value to the phase encode gradient is applied to the read axis without applying the phase encode gradient to the warp axis and the slice axis, and the read gradient is next applied to the read axis, thereby to obtain the phase information from the received NMR signal.

(2) The 0-order phase component is determined from the phase information.

The phase information shows phase information at the time that the influence of eddy currents or residual magnetization caused by the phase encode gradient is exerted on the read axis. Thus, if the phase at the gradient center is determined, the 0-order phase component caused by the eddy currents or residual magnetization which is caused by the phase encode gradient can be quantitatively recognized.

In a eighth aspect of the present invention, there is provided the MRI apparatus having the aforementioned construction, which further includes a 0-order phase component acquiring means for obtaining the 0-order phase component from an NMR signal obtained when the phase encode gradient and the rewind gradient are applied to the warp axis and an NMR signal obtained when the phase encode gradient and the rewind gradient are not applied to the warp axis.

In the MRI apparatus according to the aforementioned eighth aspect of the present invention, the 0-order phase component is determined as follows:

(1) A present-existing NMR signal is obtained by applying the phase encode gradient and the rewind gradient to the warp axis.

(2) An ideal NMR signal is obtained without applying the phase encode gradient and the rewind gradient to the warp axis.

(3) A 0-order phase quantity is determined from a phase at the gradient center of 1D (one-dimensional) Fourier transformation of the present-existing NMR signal in a read direction. Further, a 0-order phase quantity is determined from a phase at the gradient center of 1D Fourier transformation of the ideal NMR signal in the read direction. The 0-order phase component associated with the influence of the eddy currents or residual magnetization is determined from the difference between the two quantities.

If the difference between a 0-order phase component at the time that the phase encode gradient and the rewind gradient are applied to the warp axis and a 0-order phase component at the time that they are not applied to the warp axis is taken, then the 0-order phase component associated with the eddy currents or residual magnetization caused by the phase encode gradient and the rewind gradient can be quantitatively recognized.

Since the phase encode gradient and the rewind gradient are applied to the warp axis, the influence of the eddy currents or residual magnetization caused thereby is superimposed on the 0-order phase component. Thus, in order to prevent the occurrence of its superimposition, it is preferable to use those obtained by correcting the influence of the eddy currents or residual magnetization in accordance with the aforementioned first or second aspect as the phase encode gradient and the rewind gradient.

In a ninth aspect of the present invention, there is provided an MRI apparatus including an RF pulse transmitting means, a gradient magnetic field applying means and an NMR signal receiving means. In the MRI apparatus, an excitation pulse is applied by the RF pulse transmitting means. Thereafter, the RF pulse transmitting means transmits an inversion pulse therefrom, the gradient magnetic field applying means applies a phase encode gradient to a slice axis and the NMR signal receiving means receives an NMR signal therein. Further, the gradient magnetic field applying means repeats the application of a rewind gradient obtained by adding a slice-axis correction component for correcting the influence of eddy currents or residual magnetization caused by the phase encode gradient to a basic component of opposite polarity equal in time integral value to the phase encode gradient, to the slice axis or the application of a rewind gradient equivalent to the basic component and an auxiliary rewind gradient equivalent to the slice-axis correction component to the slice axis by the number of encodings in a slice-axis direction.

In the MRI apparatus according to the aforementioned ninth aspect of the present invention, the rewind gradient comprised of "(the basic component of opposite polarity equal in time integral value to the phase encode gradient) +(the slice-axis correction component for correcting the influence of the eddy currents or residual magnetization caused by the phase encode gradient)" is applied to the slice axis. Alternatively, the rewind gradient comprised of (the basic component of opposite polarity equal in time integral value to the phase encode gradient) and the auxiliary rewind gradient comprised of (the slice-axis correction component for correcting the influence of the eddy currents and residual magnetization caused by the phase encode gradient) are applied to the slice axis.

The quantity of phase encoding is returned to "0"(i.e. original rewind) based on the basic component so that the influence of the eddy currents or residual magnetization caused by the phase encode gradient is canceled by the slice-axis correction component. Therefore, the quality of an image can be prevented from being degraded by eddy currents or residual magnetization.

In a tenth aspect of the present invention, there is provided the MRI apparatus having the above-described construction, which further includes a first phase information acquiring means for receiving an NMR signal through the NMR signal receiving means while the RF pulse transmitting means transmits an RF pulse and the gradient magnetic field applying means applies a read gradient to a read axis without applying the phase encode gradient to the slice axis and thereby obtaining first phase information from the received NMR signal, a second phase information acquiring means for receiving an NMR signal through the NMR signal receiving means while the RF pulse transmitting means transmits an RF pulse, the gradient magnetic field applying means applies a difference gradient equivalent to a difference between the phase encode gradient and a basic component of a subsequent rewind gradient to the read axis, applies an equivalent phase encode gradient equal in time integral value to the phase encode gradient and an equivalent rewind gradient equal in time integral value to the basic component of the rewind gradient to the read axis without applying the phase encode gradient to the slice axis and then applies a read gradient to the read axis, and thereby obtaining second phase information from the received NMR signal, and a slice-axis correction component calculating means for determining the slice-axis correction component from the first phase information and the second phase information.

In the MRI apparatus according to the aforementioned tenth aspect of the present invention, the slice-axis correction component is determined as follows:

(1) The NMR signal is received while the RF pulse is transmitted and the read gradient is applied to the read axis without applying the phase encode gradient to the slice axis, thereby to obtain the first phase information from the received NMR signal.

(2) The NMR signal is received while the RF pulse is transmitted, the phase encode gradient is not applied to the slice axis, the difference gradient equivalent to the difference between the phase encode gradient and the basic component of the subsequent rewind gradient is applied to the read axis, the equivalent phase encode gradient identical in time integral value to the phase encode gradient and the equivalent rewind gradient equal in time integral value to the basic component of the rewind gradient are applied to the read axis, and the read gradient is applied to the read axis, thereby to obtain the second phase information from the received NMR signal.

(3) The slice-axis correction component is determined from the first phase information and the second phase information.

The first phase information corresponds to phase information which is not affected by the eddy currents or residual magnetization caused by the phase encode gradient. Further, the second phase information is of phase information at the time that the influence of the eddy currents or residual magnetization caused by the phase encode gradient is equivalently exerted onto the read axis. Thus, if the first phase information is compared with the second phase information, then the influence of the eddy currents or residual magnetization caused by the phase encode gradient can be quantitatively recognized. Accordingly, the slice-axis correction component for canceling the influence can be quantitatively determined.

Further objects and advantages of the present invention will be apparent from the following description of the preferred embodiments of the invention as illustrated in the accompanying drawings.

BRIEF DESCRIPTION OF THE DRAWINGS

The invention will hereinafter be described with reference to the accompanying drawings wherein.

DETAILED DESCRIPTION OF THE PREFERRED EMBODIMENTS

The present invention will hereinafter be described in detail with reference to the preferred embodiments shown the accompanying drawings.

[First embodiment]

Figure 1:
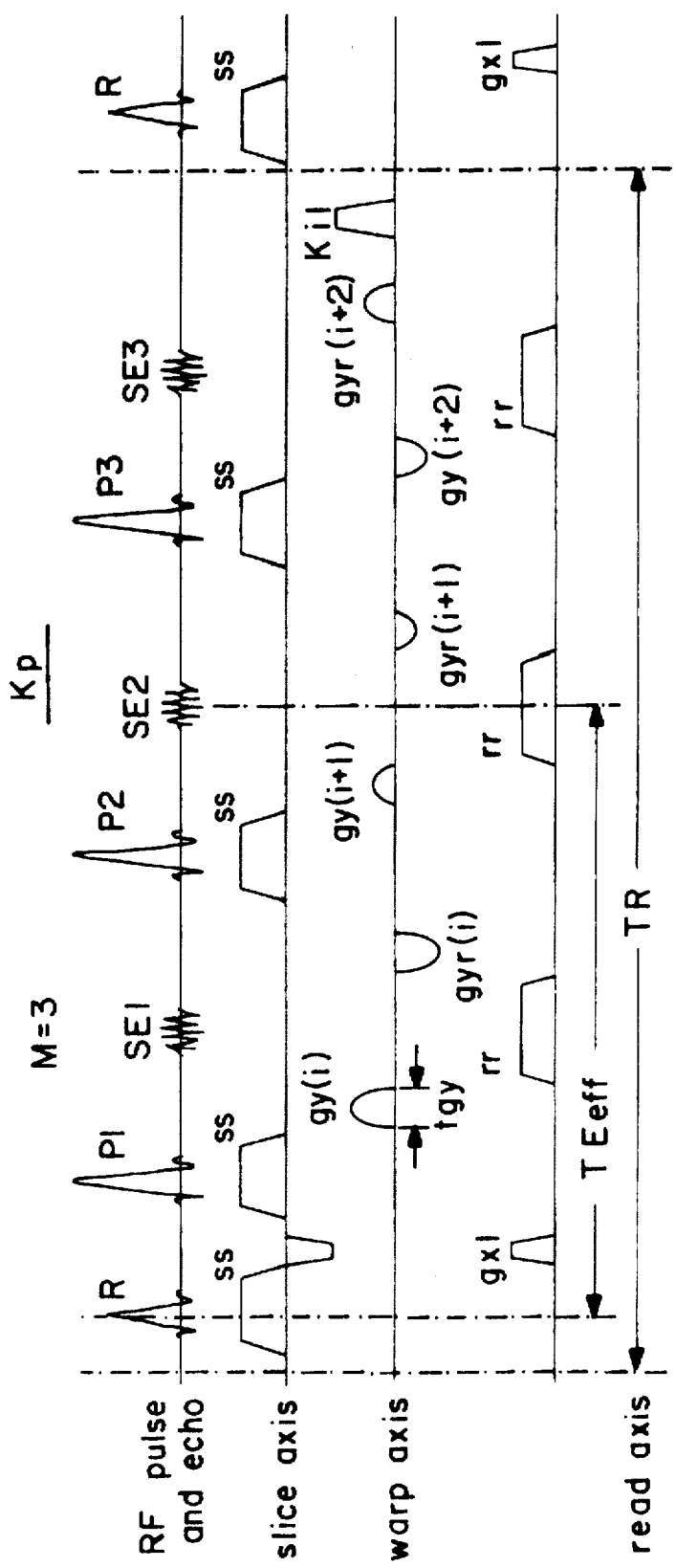
FIG. 1 is a view for describing a pulse sequence employed in a prior art high-speed SE method.
Figure 2:
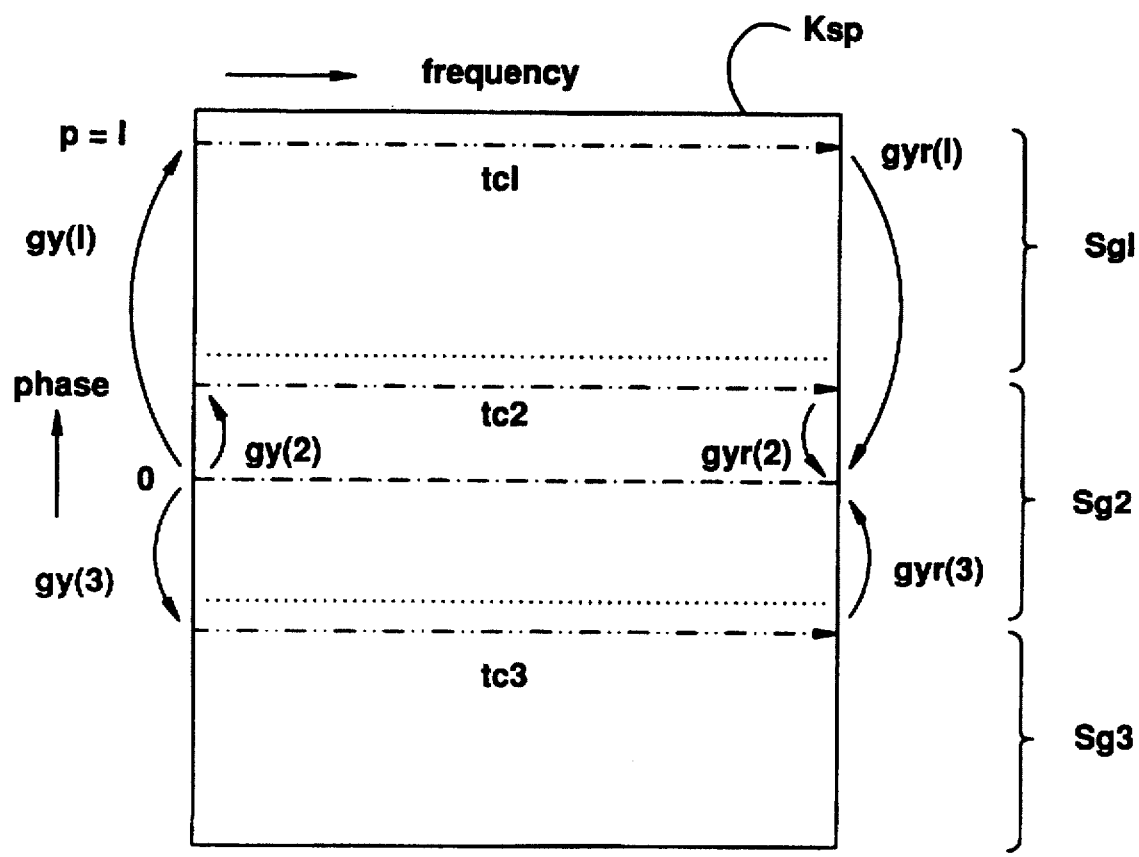
FIG. 2 is a view for describing a locus of collection of data in a k-space.
Figure 3:
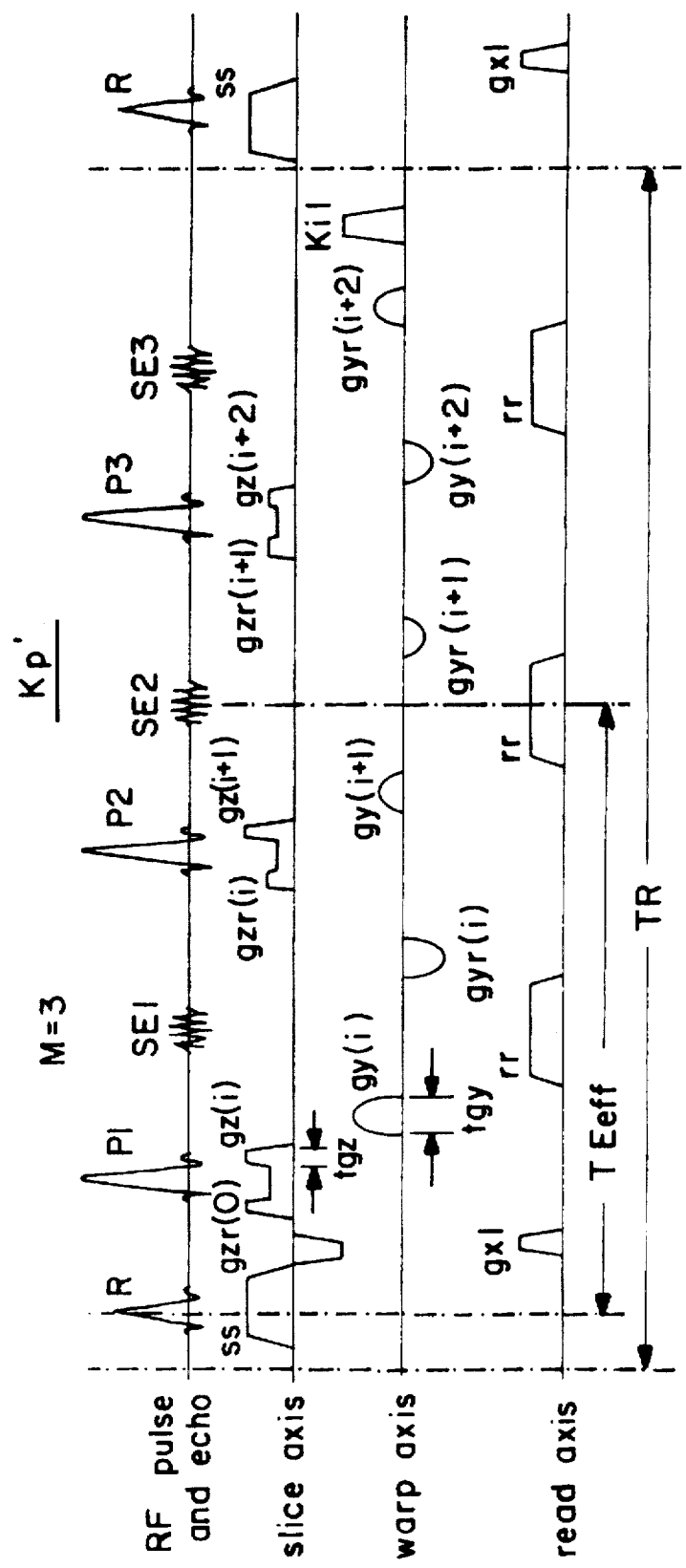
FIG. 3 is a view for describing a pulse sequence employed in a prior art 3D high-speed SE method.
Figure 4A:
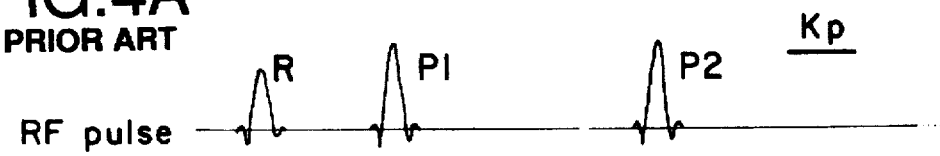
FIG. 4 is a view for describing problems produced in the prior art high-speed SE method.
Figure 4B:
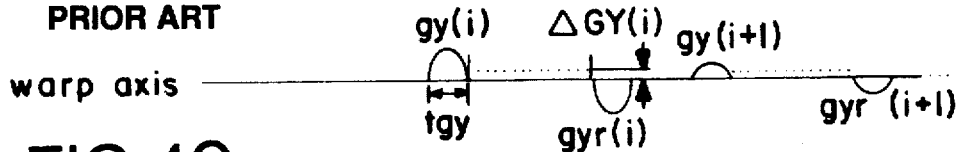
Figure 4C:
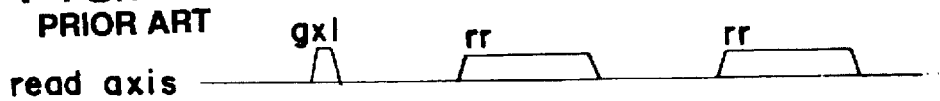
Figure 4D:
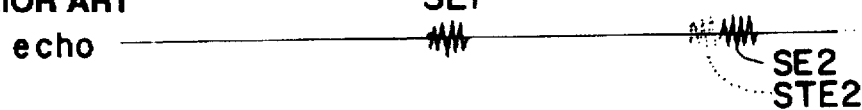
Figure 5A:
FIG. 5 is a view for describing problems created by the prior art 3D high-speed SE method.
Figure 5B:
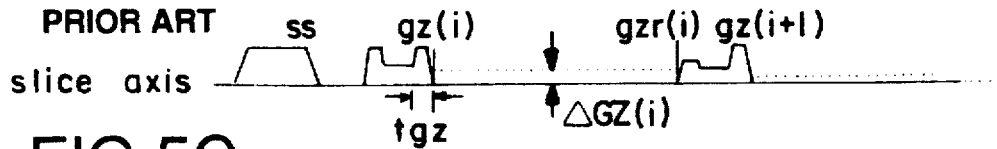
Figure 5C:
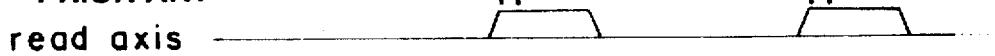
Figure 5D:
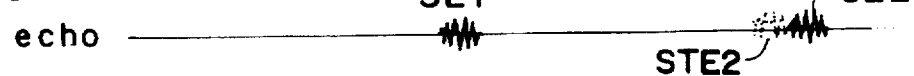
Figure 6:
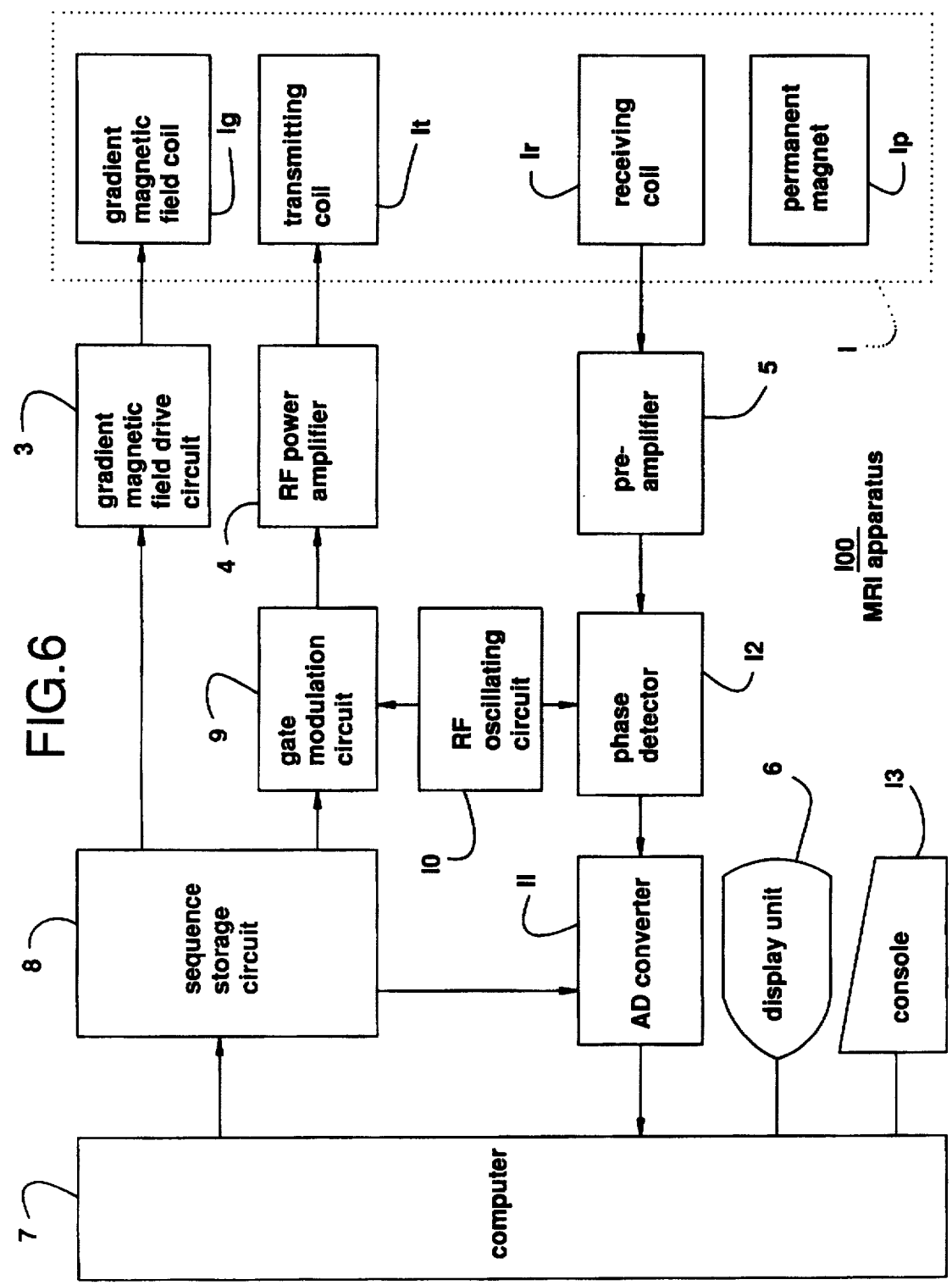
FIG. 6 is a block diagram showing an MRI apparatus according to a first embodiment of the present invention.

FIG. 6 is a block diagram showing an MRI apparatus according to a first embodiment of the present invention.

MRI apparatus 100 comprises, a magnet assembly 1 has a space portion (e.g. hole) for inserting an object to be examined or a sample therein; and surrounding the space portion a permanent magnet 1p for applying a predetermined main magnetic field to the sample, a gradient magnetic field coil 1g for generating or producing gradient magnetic fields for a slice axis, a warp axis and a read axis, a transmitting coil 1t for supplying an RF pulse used for exciting a spin of an atomic nucleus in the sample, and a receiving coil 1r for detecting an NMR signal from the sample. The gradient magnetic field coil 1g, the transmitting coil 1t and the receiving coil 1r are respectively electrically connected to a gradient magnetic field drive circuit 3, an RF power amplifier 4 and a preamplifier 5.

In response to instructions issued from a computer 7, a sequence storage circuit 8 operates the gradient magnetic field drive circuit 3 based on a pulse sequence stored therein to produce a gradient magnetic field from the gradient magnetic field coil 1g of the magnet assembly 1. Further, the sequence storage circuit 8 operates a gate modulation circuit 9 to convert a carrier output signal produced from an RF oscillating circuit 10 into a pulse-shaped signal of a predetermined timing and a predetermined envelope shape and sends the modulated signal to the RF power amplifier 4 as an RF pulse, where it is subjected to power amplification. Thereafter, the so-amplified signal is applied to the transmitting coil 1t of the magnet assembly 1 to selectively excite an intended slice region.

The preamplifier 5 amplifies the NMR signal detected from the sample by the receiving coil 1r of the magnet assembly 1 and inputs the amplified signal to a phase detector 12. The phase detector 12 determines the carrier output signal produced from the RF oscillating circuit 10 as a reference signal. Further, the phase detector 12 phase-detects the NMR signal sent from the preamplifier 5 and supplies it to an A/D converter 11. The A/D converter 11 converts the phase-detected analog signal into a digital signal and inputs it to the computer 7.

The computer 7 reads data from the A/D converter 11 and performs an image reconfiguration computation on the data to produce an image in the intended slice region. The image is displayed on a display unit 6. Further, the computer 7 takes or performs the overall control such as reception of information inputted from a console 13, or the like.

Figure 7:
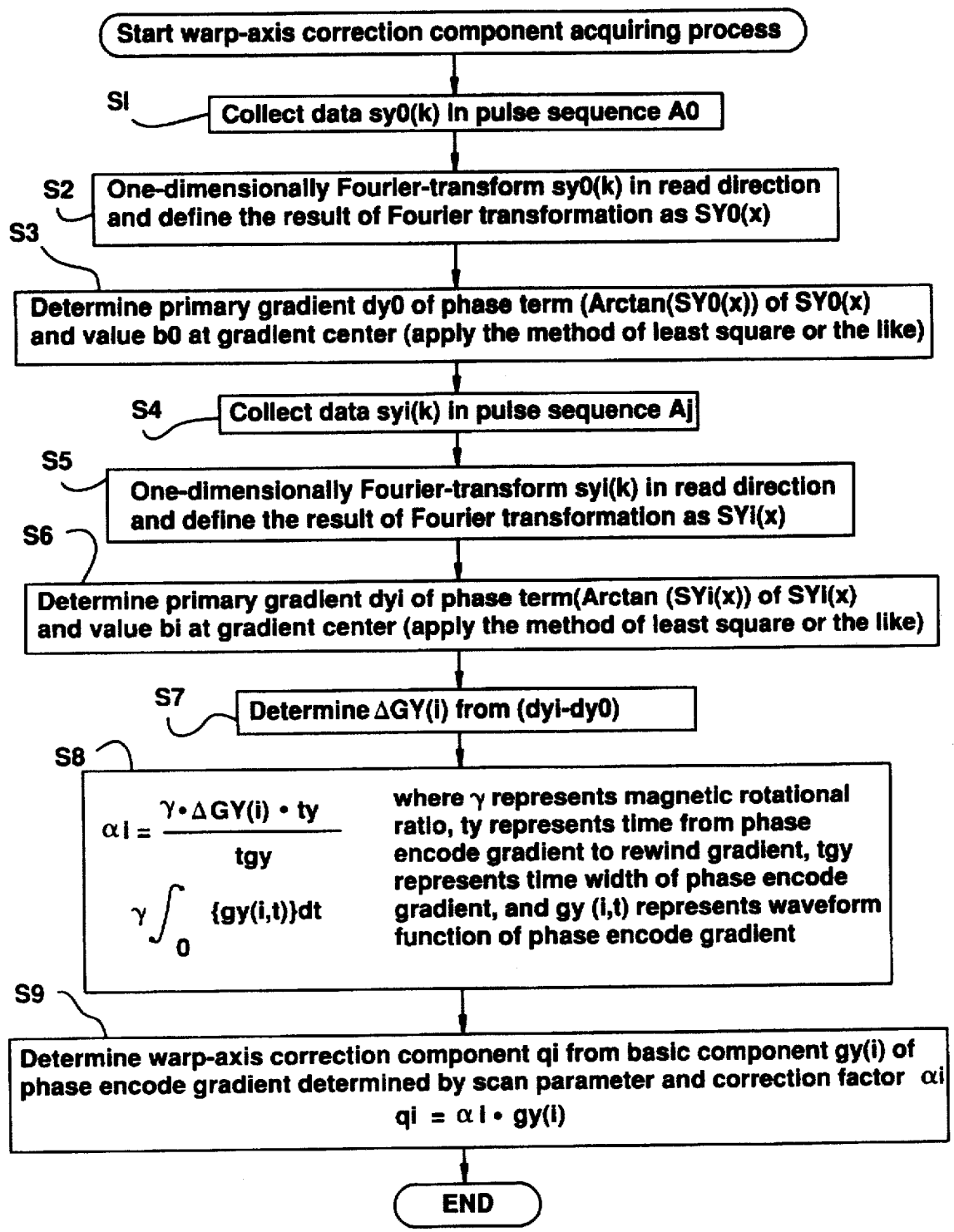
FIG. 7 is a flowchart for describing a warp-axis correction component acquiring process employed in the first embodiment.

FIG. 7 is a flowchart for describing a warp-axis correction component acquiring process employed in the MRI apparatus 100.

Figure 8:
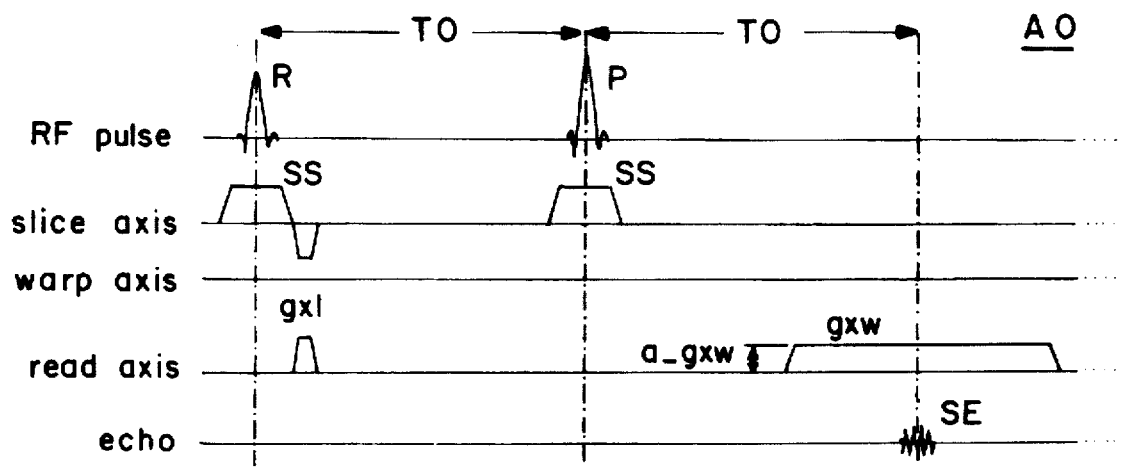
FIG. 8 is a view for explaining one example of a pulse sequence employed in the warp-axis correction component acquiring process shown in FIG. 7.

At Step S1, data sy0(k) is collected in accordance with a pulse sequence A0 shown in FIG. 8. In the pulse sequence A0, an excitation pulse R and a slice gradient ss are first applied and an inversion pulse P and a slice gradient ss are next applied. Next, an NMR signal is received from an echo SE while a read gradient gxw is being applied thereby to collect the data sy0(k). Incidentally, a phase encode gradient is not applied to a warp axis.

At Step S2, the data sy0(k) is one-dimensionally Fourier-transformed in a read direction and the result of Fourier transformation is defined as SY0(x).

At Step S3, a primary gradient dy0 of a phase term (Arctan(SY0(x))) of the result of Fourier transformation SY0(x) is determined (it is determined by application of a method of least square or the like). Further, a phase quantity b0=Arctan(SY0(0)) at the center of the gradient is determined. The phase quantity b0 corresponds to a phase quantity at the center of the gradient at the time that no residual magnetization exists.

Steps S1 through S3 referred to above are equivalent to a process for determining influence or effect (a shift or displacement from the echo center of the echo signal SE) of eddy currents mainly caused by the gradient magnetic fields gx1 and gxw.

Figure 9:
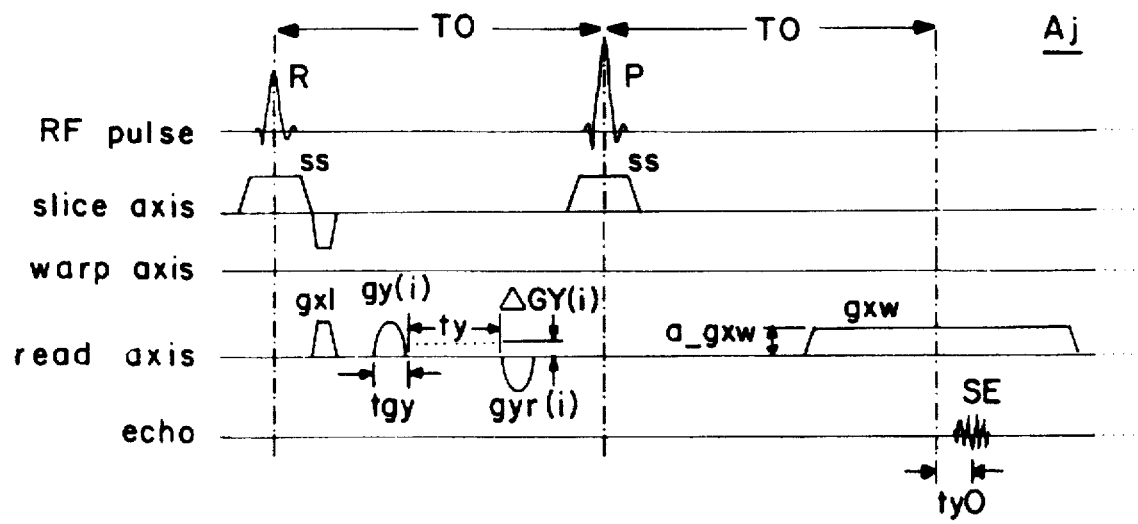
FIG. 9 is a view for explaining another example of the pulse sequence employed in the warp-axis correction component acquiring process shown in FIG. 7.

At Step S4, data syi(k) is collected in accordance with a pulse sequence Aj shown in FIG. 9. In the pulse sequence Aj, an excitation pulse R and a slice gradient ss are first applied and an equivalent phase encode gradient gy(i) equal in time integral value to a phase encode gradient gy(i) of an encode number i determined by a scan parameter is next applied to a read axis. After a time ty(set as long as possible to improve accuracy)has elapsed, an equivalent rewind gradient gyr(i) of opposite polarity, which is equal in time integral value to the equivalent phase encode gradient gy(i), is applied to the read axis. Next, an inversion pulse P and a slice gradient ss are applied and thereafter an NMR signal is received from an echo SE while a read gradient gxw is being applied thereby to collect the data syi(k). Incidentally, no phase encode gradient is applied to a warp axis. Here, Step S4 may be repeated for all the encode numbers i (j=i in this case). As an alternative, however, Step S4 is repeated for an encode number i properly selected to shorten the time (j ≠i) and data about the unselected encode numbers may be determined by interpolation. To provide the most simplicity, Step S4 is executed only for an encode number for providing the maximum phase encode gradient (j=1 alone in this case), whereas data about other encode numbers may be calculated in proportion to the encode gradient.

At Step S5, the data syi(k) is one-dimensionally Fourier-transformed in a read direction and the result of Fourier transformation is defined as SYi(x).

At Step S6, a primary gradient dyi of a phase term (Arctan(SYi(x))) of the result of Fourier transformation SYi(x) is determined (by application of the method of least square or the like). Further, a phase quantity bi=Arctan(SYi (0)) at the center of the gradient is determined and a difference (bi−b0) between the phase quantities bi and b0 is determined. The difference (bi−b0) corresponds to a 0-order phase component which is uniformly added without depending on the position under the influence of residual magnetization caused by the phase encode gradient gy(i).

Steps S4 through S6 referred to above correspond to a process for determining influence or effect of the residual magnetization mainly caused by the phase encode gradient gy(i).

At Step S7, a magnitude ΔGY(i) of influence or effect of the eddy currents and residual magnetization caused by the equivalent phase encode gradient gy(i) is calculated from (dyi−dy0).

The term dy0 indicates a phase cycle or rotation at the time that no phase encode gradient exists. On the other hand, the term dyi indicates a phase cycle or rotation at the time that the equivalent phase encode gradient gy(i) exists. Since the equivalent phase encode gradient gy(i) is originally canceled by the equivalent rewind gradient gyr(i), (dyi−dy0) should have been equal to 0. Thus, if (dyi−dy0)≠0, the magnitude of the difference therebetween represents the magnitude of the influence of the eddy currents and residual magnetization caused by the equivalent phase encode gradient gy(i). Accordingly, ΔGY(i) corresponding to the magnitude of the influence of the eddy currents and residual magnetization caused by the equivalent phase encode gradient gy(i) can be calculated from (dyi−dy0).

Namely, when the amplitude of a read gradient gxw is regarded as a__gxw and a shift time of the echo center due to influence of the eddy currents and residual magnetization caused by the equivalent phase encode gradient gy(i) is regarded as ty0, the following relation is obtained:

γ·ΔGY(i)·ty=γ·a__gxw·ty0 (where γ is a magnetic rotational ratio.)

Thus, the following equation is established:

$$\Delta GY(i)=a\_gxw \cdot ty0/ty$$

At Step S8, a correction factor α i (corresponding to the magnitude of influence of eddy currents and residual magnetization per unit phase encode quantity) is determined in accordance with the following equation:

$$\alpha i = \gamma \cdot \Delta GY(i) \cdot ty/\gamma \int_0^{tgy} (gy(i,t))dt \qquad (1)$$

where γ represents a magnetic rotational ratio, ty represents a time from a phase encode gradient to a rewind gradient, tgy represents a time width of the phase encode gradient, and gy(i,t) represents a waveform function of the phase encode gradient.

At Step S9, a warp-axis correction component qi is determined from a fundamental or basic component gy(i) of the phase encode gradient determined by a scan parameter and the correction factor α i:

$$qi=\alpha i \cdot gy(i) \text{ (where } qi \leq 1.0)$$

Figure 10:
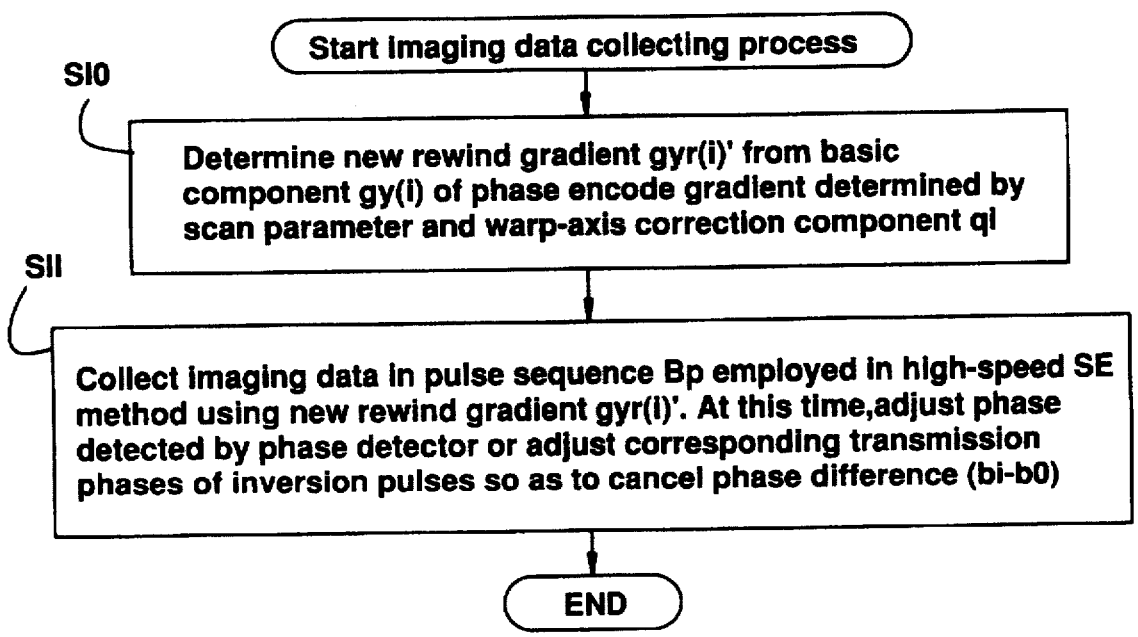
FIG. 10 is a flowchart for describing an imaging data collecting process employed in the first embodiment.

FIG. 10 is a flowchart for describing an imaging data collecting process employed in the MRI apparatus 100.

At step s10, a new rewind gradient gyr(i)' is determined from the basic component gy(i) of the phase encode gradient determined by the scan parameter and the warp-axis correction component qi:

$$gyr(i)'=0.01 \cdot gy(i)+qi$$

Figure 11:
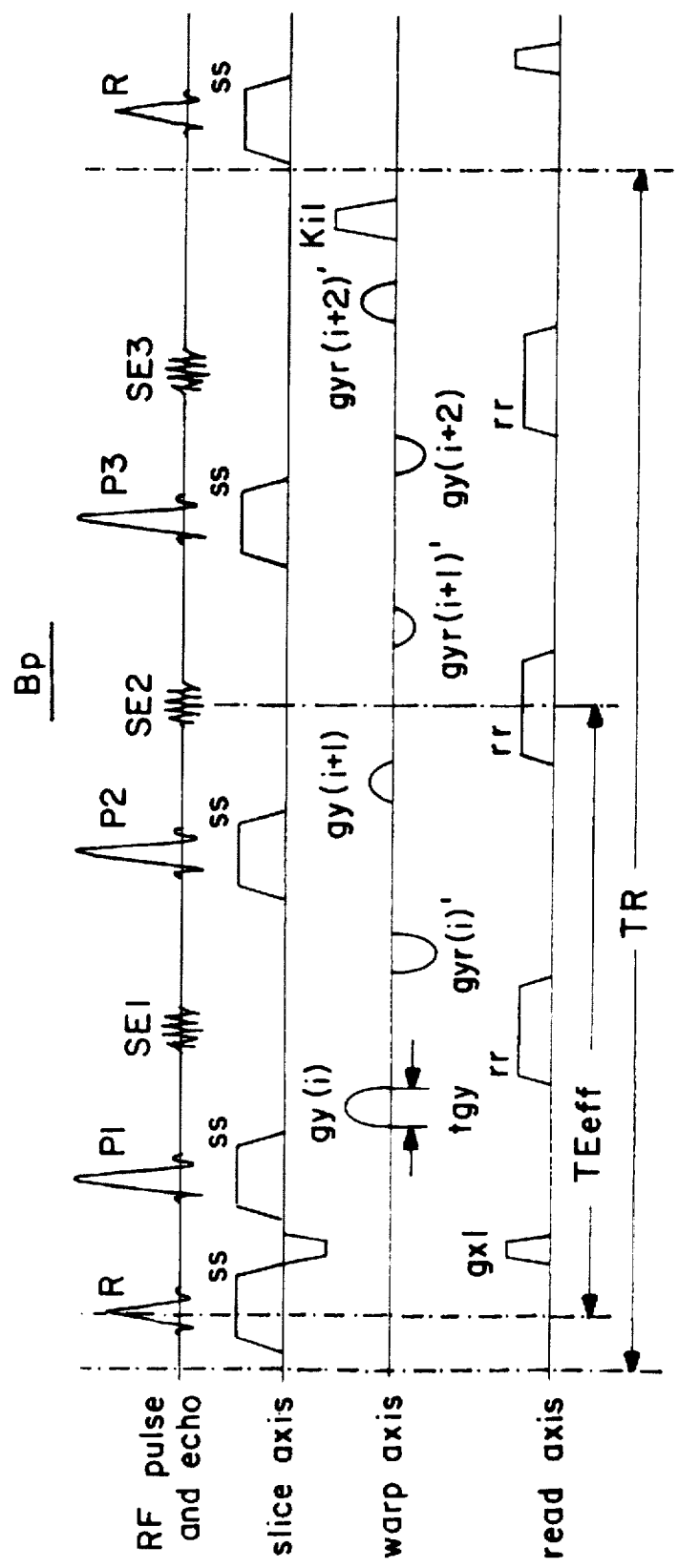
FIG. 11 is a view illustrating one example of a pulse sequence employed in the imaging data collecting process shown in FIG. 10.

At Step S11, imaging data are collected in accordance with a pulse sequence Bp employed in a high-speed SE method using the new rewind gradient gyr(i)' shown in FIG. 11. At this time, the phase detected by the phase detector 12 is adjusted or the corresponding transmission phases of inversion pulses P1, P2 and P3 are adjusted so as to cancel the difference (bi−b0) in phase quantity.

If imaging is performed using the imaging data collected in the above-described manner, it is possible to prevent the quality of an image from being degraded by the eddy currents and residual magnetization caused by the phase encode gradient on the warp axis.

[Second embodiment]

The second embodiment shows a modification of the first embodiment. A warp-axis correction component qi is acquired in a manner similar to the first embodiment. However, imaging data are collected in accordance with a pulse sequence Cp shown in FIG. 12 in place of the pulse sequence Bp shown in FIG. 11.

Figure 12:
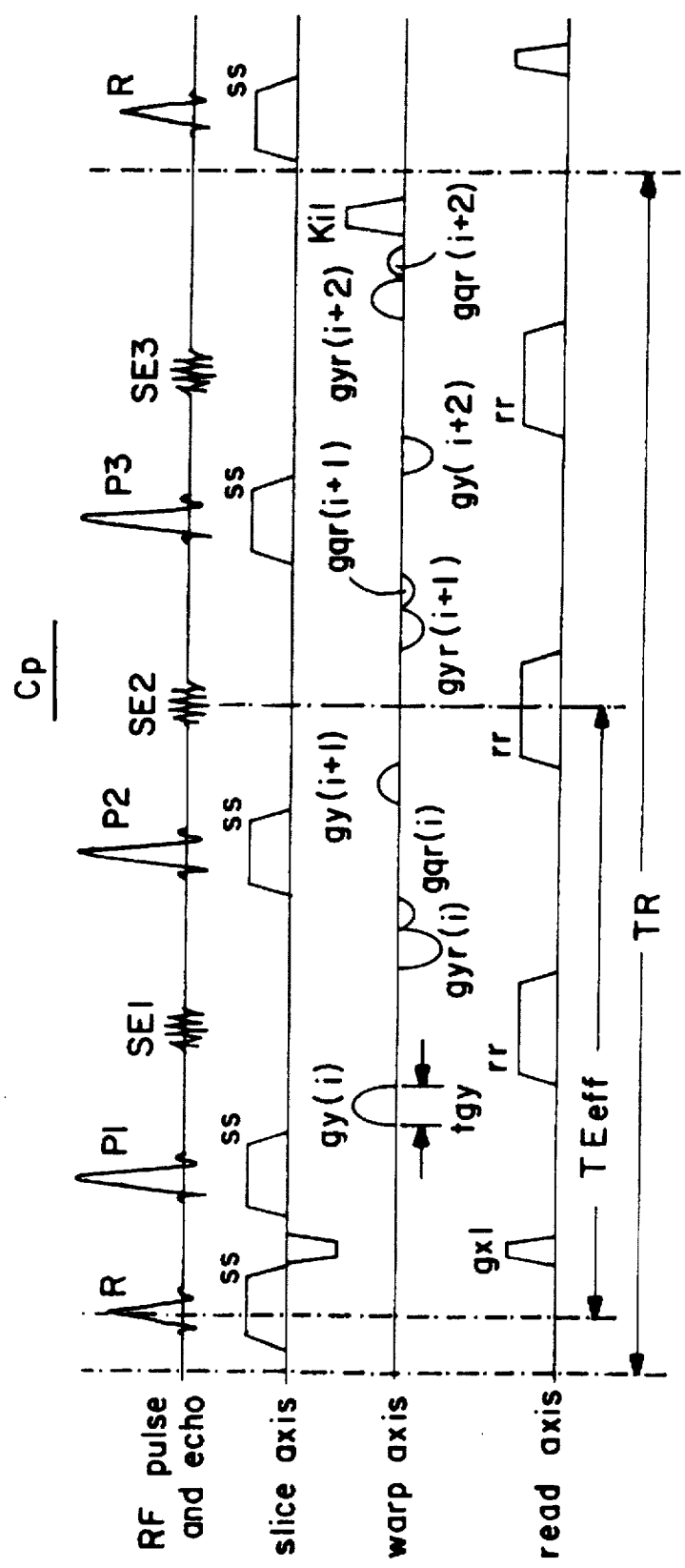
FIG. 12 is a view illustrating one example of a pulse sequence employed in an imaging data collecting process executed in a second embodiment.

Namely, as shown in FIG. 12, a rewind gradient gyr(i) equivalent to the aforementioned basic component gy(i) is applied to a warp axis and an auxiliary rewind gradient gqr(i) equivalent to the aforementioned warp-axis correction component qi is applied to the warp axis.

Even if imaging is made using the imaging data collected in the above-described manner, it is possible to prevent the quality of an image from being degraded by eddy currents or residual magnetization caused by a phase encode gradient.

[Third embodiment]

Figure 13:
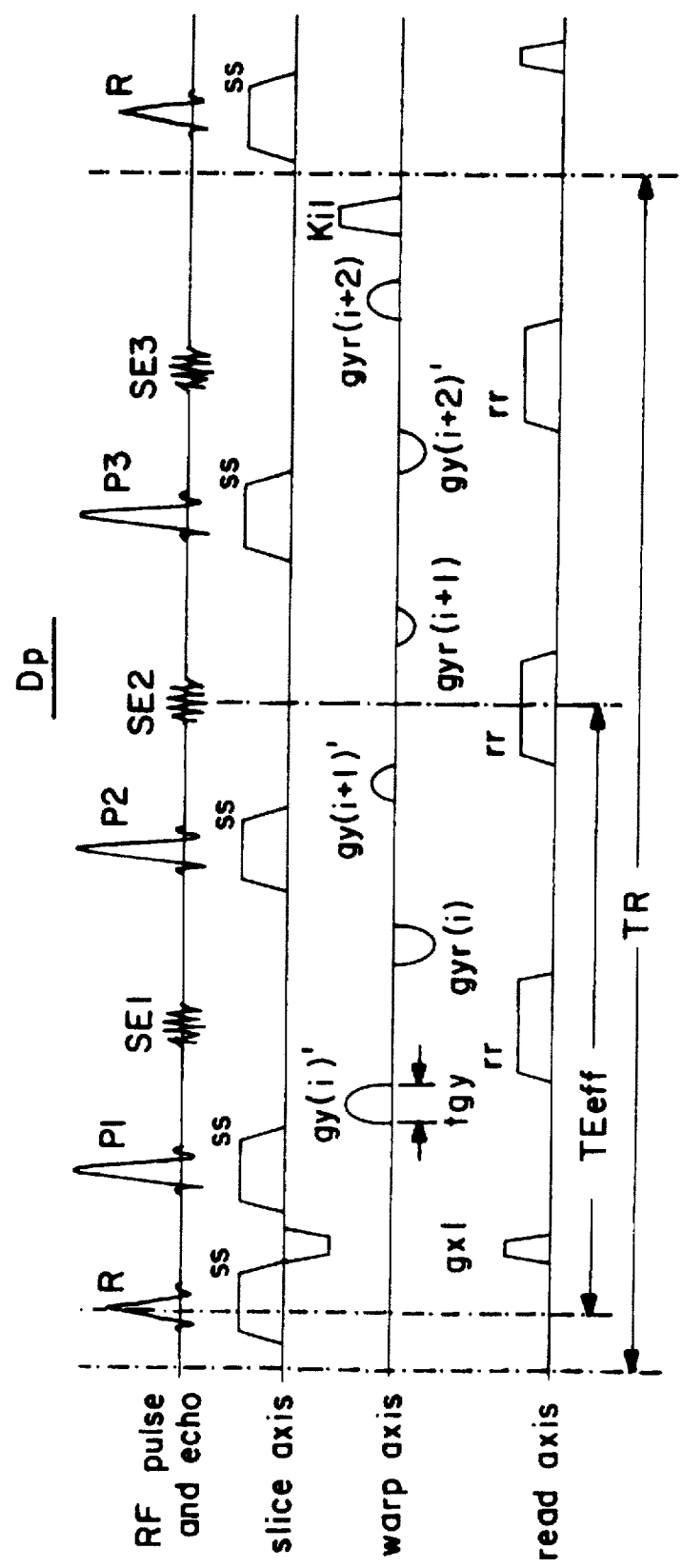
FIG. 13 is a view illustrating one example of a pulse sequence employed in an imaging data collecting process executed in a third embodiment.

The third embodiment shows a modification of the first embodiment. A warp-axis correction component qi is obtained in the same manner as described in the first embodiment. However, a new phase encode gradient gy(i)' is determined from a basic component gy(i) of a phase encode gradient determined by a scan parameter and the warp-axis correction component qi. Thereafter, imaging data are collected in accordance with a pulse sequence Dp employed in a high-speed SE method using the new phase encode gradient gy(i)' as shown in FIG. 13.

Even if imaging is carried out using the imaging data collected in the above-described manner, it is possible to prevent the quality of an image from being degraded by eddy currents or residual magnetization caused by the phase encode gradient.

[Fourth embodiment]

Figure 14:
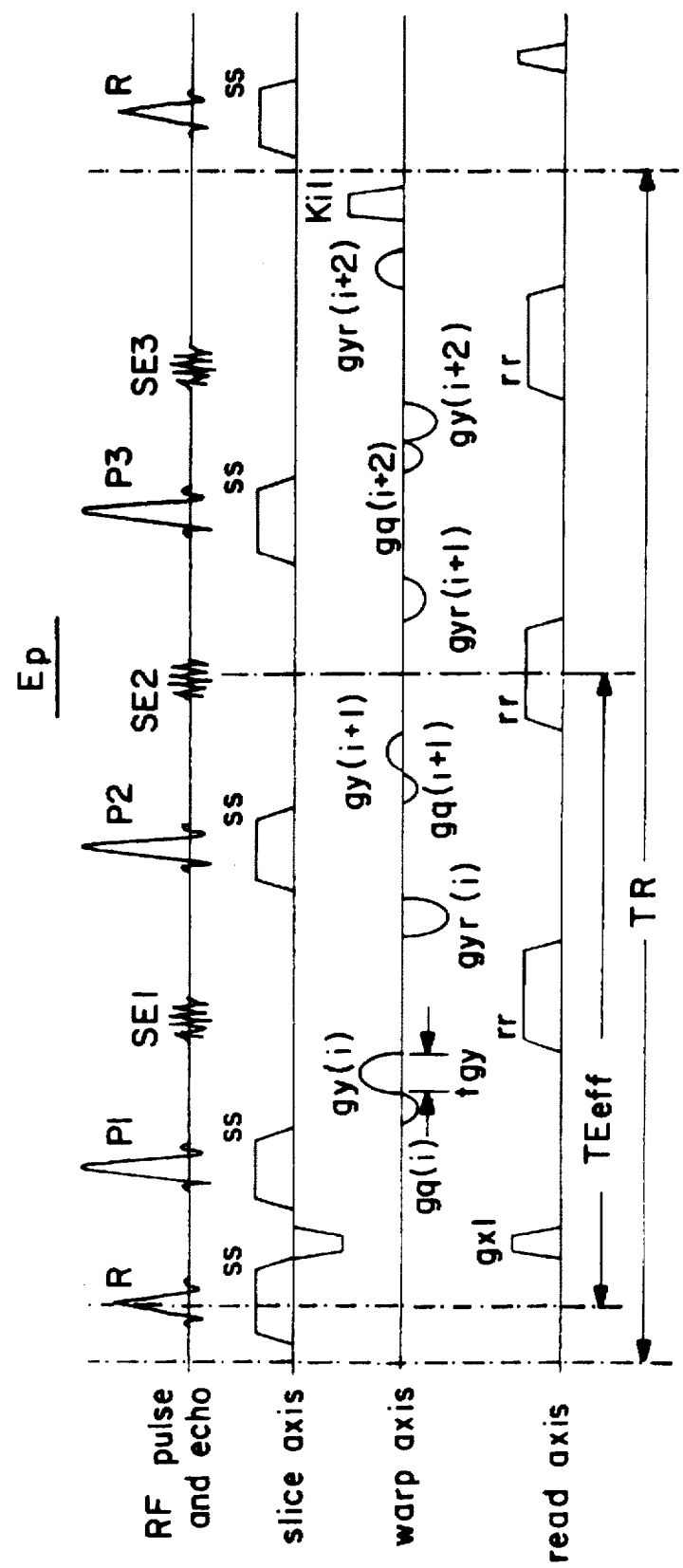
FIG. 14 is a view illustrating one example of a pulse sequence employed in an imaging data collecting process executed in a fourth embodiment.

The fourth embodiment shows a modification of the first embodiment. A warp-axis correction component qi is acquired in a manner similar to the first embodiment. As shown in FIG. 14, however, a phase encode gradient gy(i) equivalent to the aforementioned basic component gy(i) is applied to a warp axis and imaging data are collected in accordance with a pulse sequence Ep employed in a high-speed SE method wherein an auxiliary phase encode gradient gq(i) equivalent to the aforementioned warp-axis correction component qi is applied to the warp axis.

Even if imaging is made using the imaging data collected in the above-described manner, it is possible to prevent the quality of an image from being degraded by eddy currents or residual magnetization caused by the phase encode gradient.

[Fifth embodiment]

Figure 15:
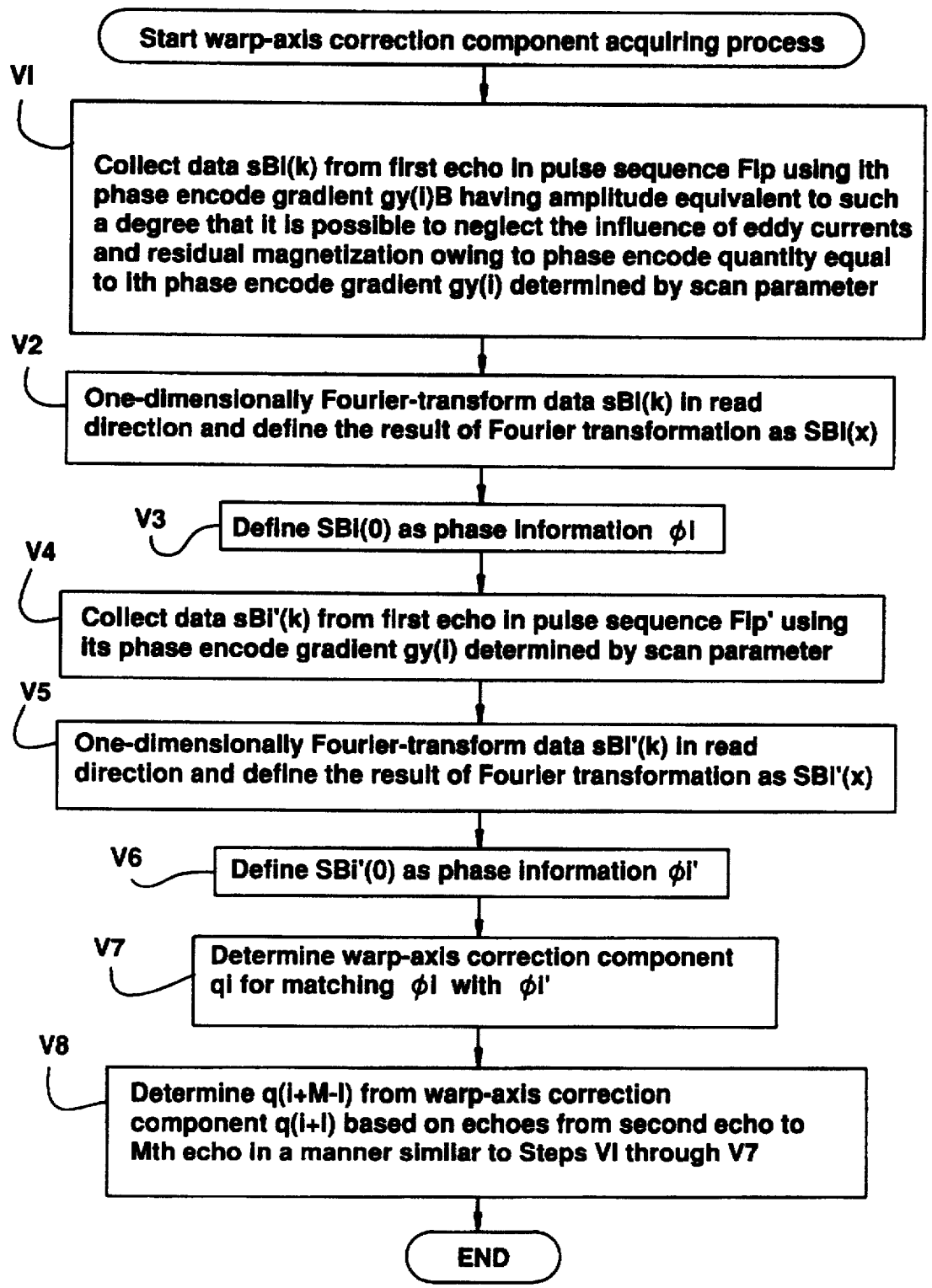
FIG. 15 is a flowchart for describing a warp-axis correction component acquiring process employed in a fifth embodiment.

In the fifth embodiment, a warp-axis correction component acquiring process shown in FIG. 15 is executed in place of the warp-axis correction component acquiring process shown in FIG. 7.

FIG. 15 is a flowchart for describing the warp-axis correction component acquiring process employed in the fifth embodiment.

Figure 16:
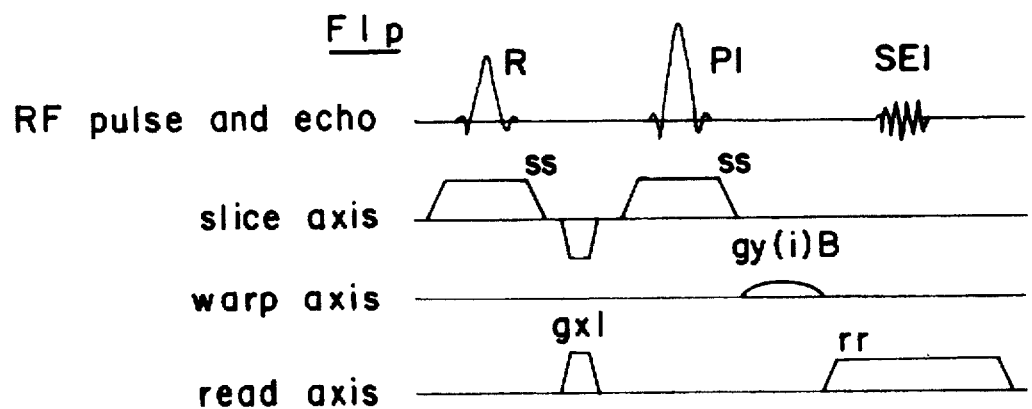
FIG. 16 is a view illustrating one example of a first echo of a pulse sequence employed in the warp-axis correction component acquiring process shown in FIG. 15.

At Step V1, data sBi(k) is collected from a first echo in accordance with a pulse sequence F1p shown in FIG. 16 using an ith phase encode gradient gy(i)B having an amplitude equivalent to such a degree that it is possible to neglect the influence of eddy currents and residual magnetization owing to a phase encode quantity equal to an ith phase encode gradient gy(i) decided by a scan parameter.

At Step V2, the data sBi(k) is one-dimensionally Fourier-transformed in a read direction and the result of Fourier transformation is defined as SBi(x).

At Step V3, a value SBi(0) which is the value of SBi(x) in the x=0, will be defined as ideal phase information $\phi$ i. The ideal phase information $\phi$ i represents an offset component (0-order phase component) of a phase at the time of the absence of the influence of the eddy currents and residual magnetization caused by the phase encode gradient.

Figure 17:
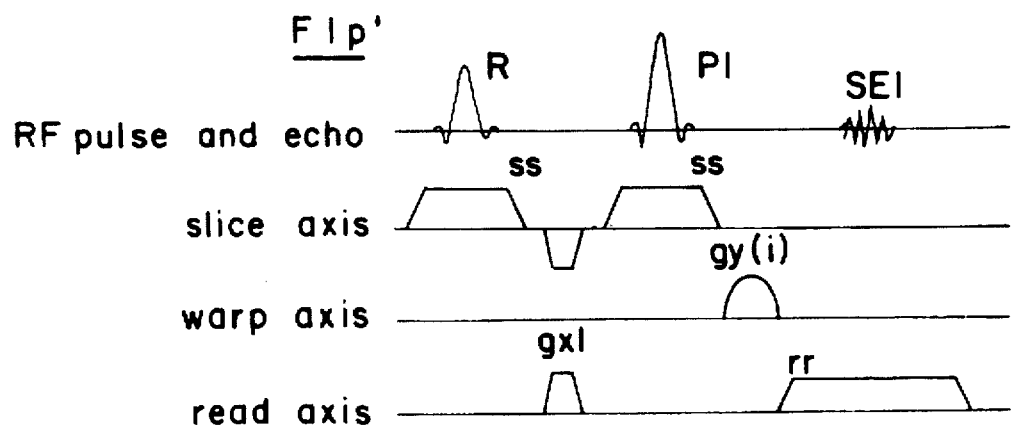
FIG. 17 is a view illustrating another example of the first echo of the pulse sequence employed in the warp-axis correction component acquiring process shown in FIG. 15.

At Step V4, data sBi' (k) is collected from a first echo in accordance with a pulse sequence F1p' shown in FIG. 17 using an ith phase encode gradient gy(i) determined by a scan parameter.

At Step V5, the data sBi' (k) is one-dimensionally Fourier-transformed in a read direction and the result of Fourier transformation is defined as SBi' (x).

At Step V6, a value SBi' (0) which is the value of SBi' (x) in the x=0, will be defined as the present-existing phase information $\phi$ i'. The phase information $\phi$ i' shows an offset component (0-order phase component) of a phase at the time of the presence of the influence of the eddy currents and residual magnetization caused by the phase encode gradient.

At Step V7, a warp-axis correction component qi to be added for matching the phase information $\phi$i' with the ideal phase information $\phi$ i is calculated based on magnet characteristics of the permanent magnet type MRI apparatus.

At Step V8, q(i+M−1) is determined from a warp-axis correction component q(i+1) based on echoes from a second echo to an Mth echo in a manner similar to Steps V1 through V7 referred to above.

Figure 18:
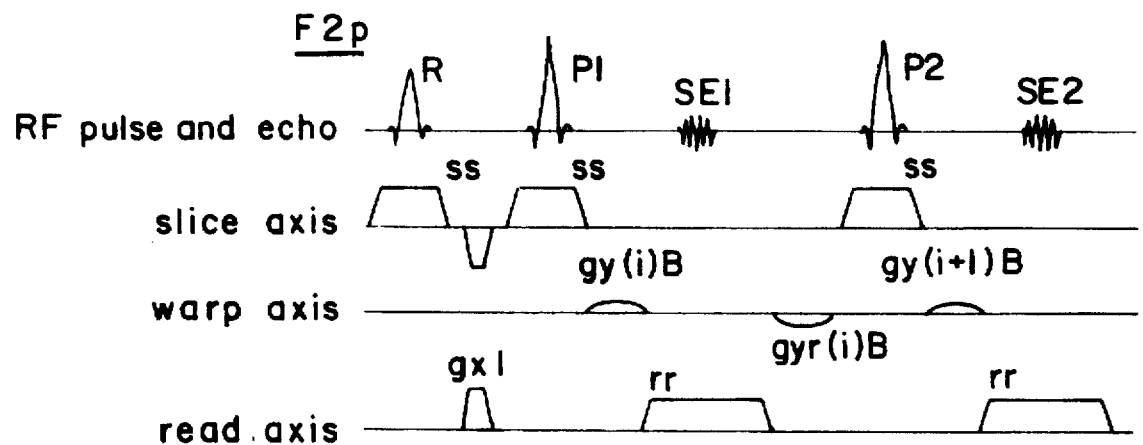
FIG. 18 is a view showing one example of a second echo of the pulse sequence employed in the warp-axis correction component acquiring process shown in FIG. 15.
Figure 19:
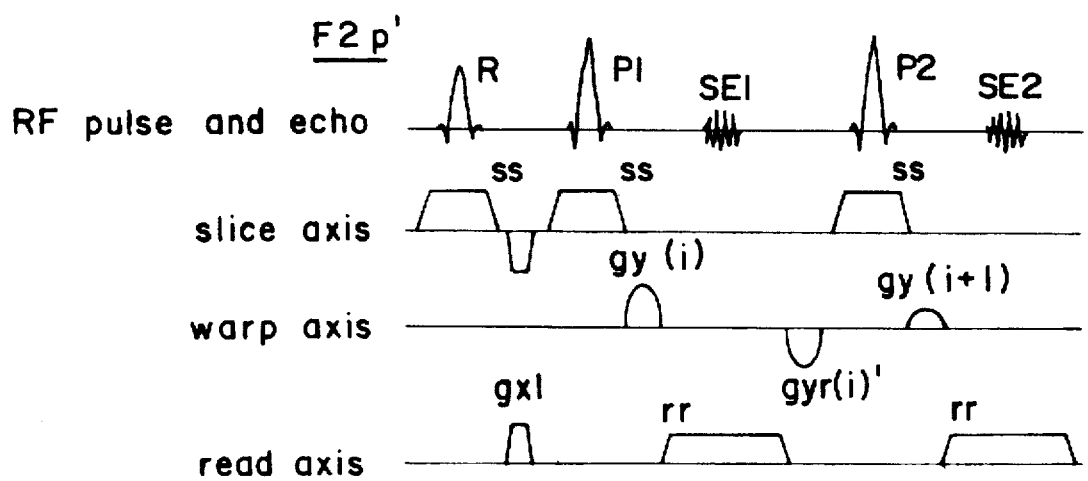
FIG. 19 is a view illustrating another example of the second echo of the pulse sequence employed in the warp-axis correction component acquiring process shown in FIG. 15.

FIGS. 18 and 19 respectively show pulse sequences F2p and F2p' at the time of the second echo.

Figure 20:
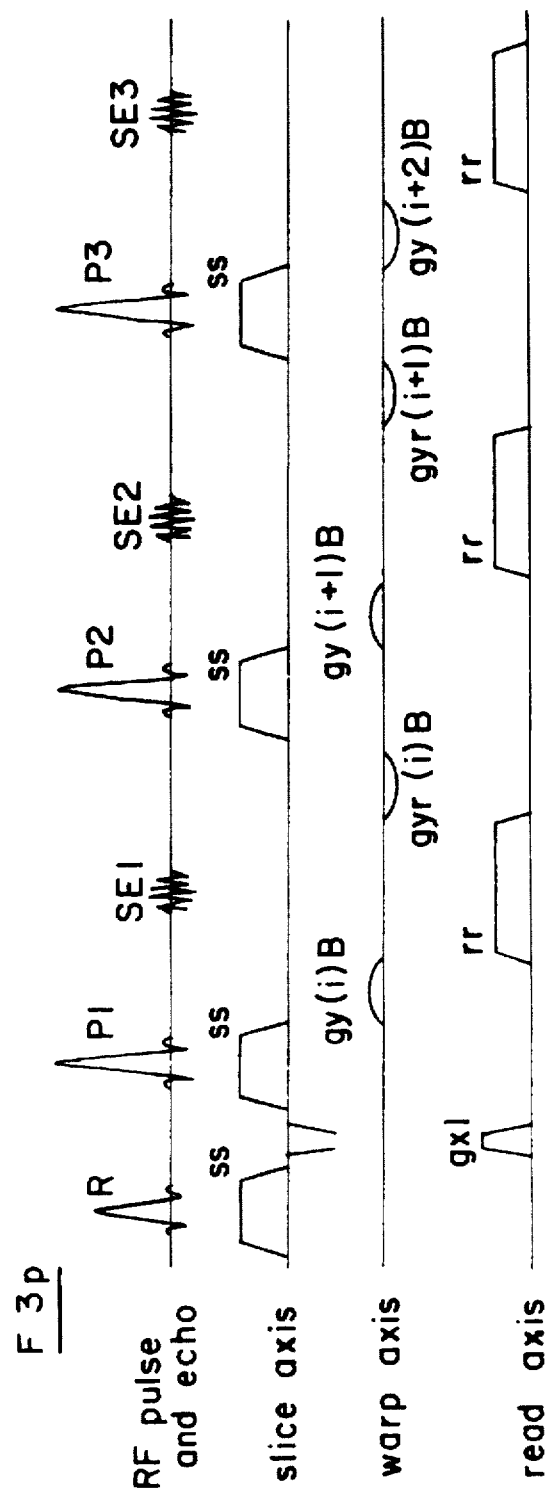
FIG. 20 is a view showing one example of a third echo of the pulse sequence employed in the warp-axis correction component acquiring process shown in FIG. 15.
Figure 21:
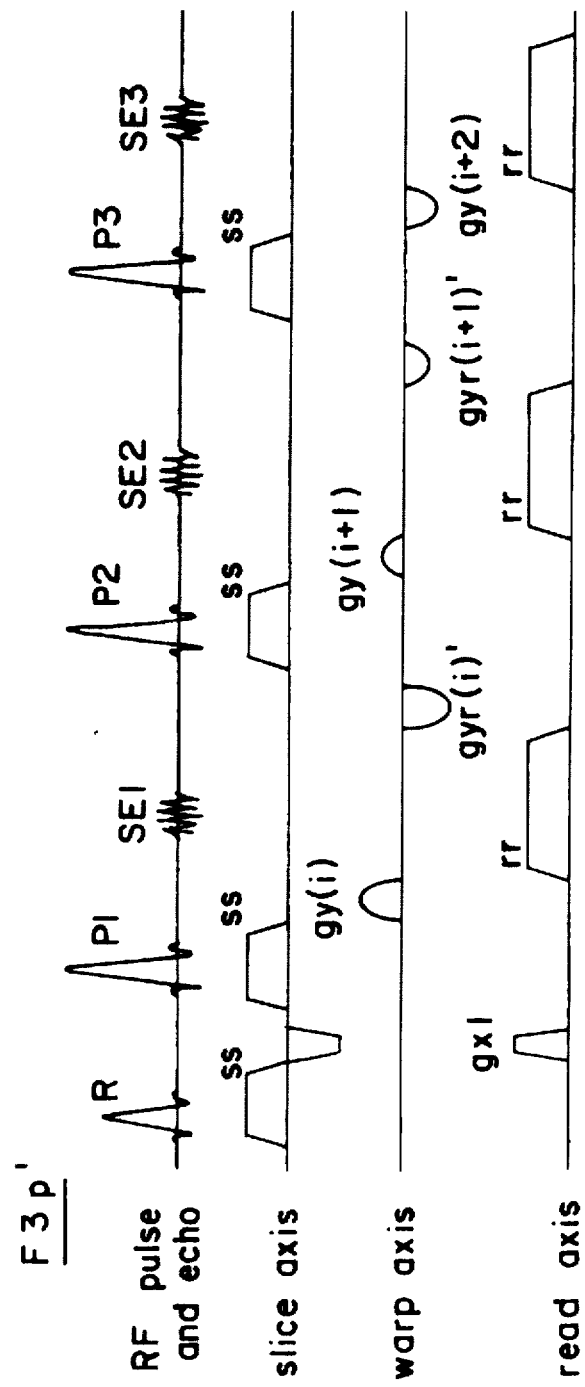
FIG. 21 is a view illustrating another example of the third echo of the pulse sequence employed in the warp-axis correction component acquiring process shown in FIG. 15.

FIGS. 20 and 21 respectively illustrate pulse sequences F3p and F3p' at the time of the third echo.

The imaging data shown in FIGS. 10 through 14 are collected using the thus-determined warp-axis correction component qi. Even if imaging is performed using the imaging data, the quality of an image can be prevented from being degraded by the eddy currents and residual magnetization caused by the phase encode gradient.

[Sixth embodiment]

The sixth embodiment shows the case where the influence of eddy currents or residual magnetization caused by a phase encode gradient is suppressed by switching the polarity of a killer slant or gradient.

Figure 22:
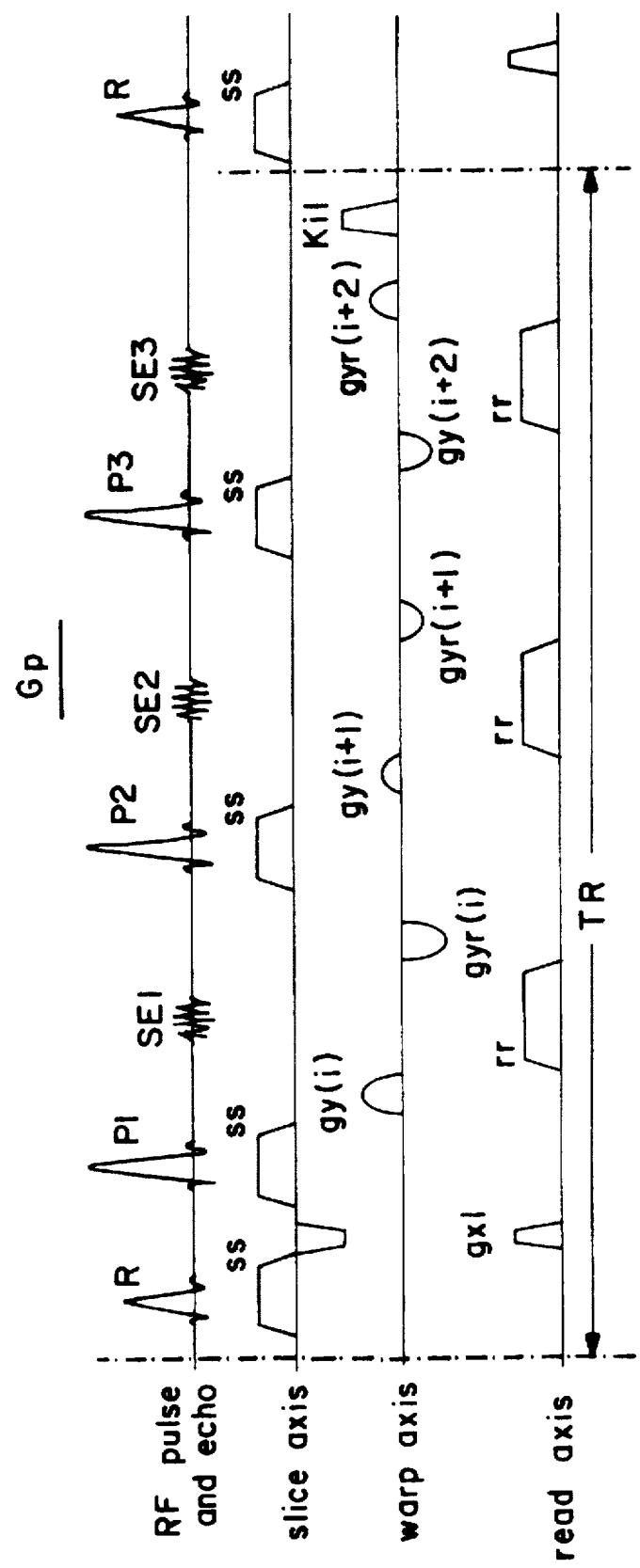
FIG. 22 is a view showing one example of a pulse sequence employed in an imaging data collecting process executed in a sixth embodiment.
Figure 23:
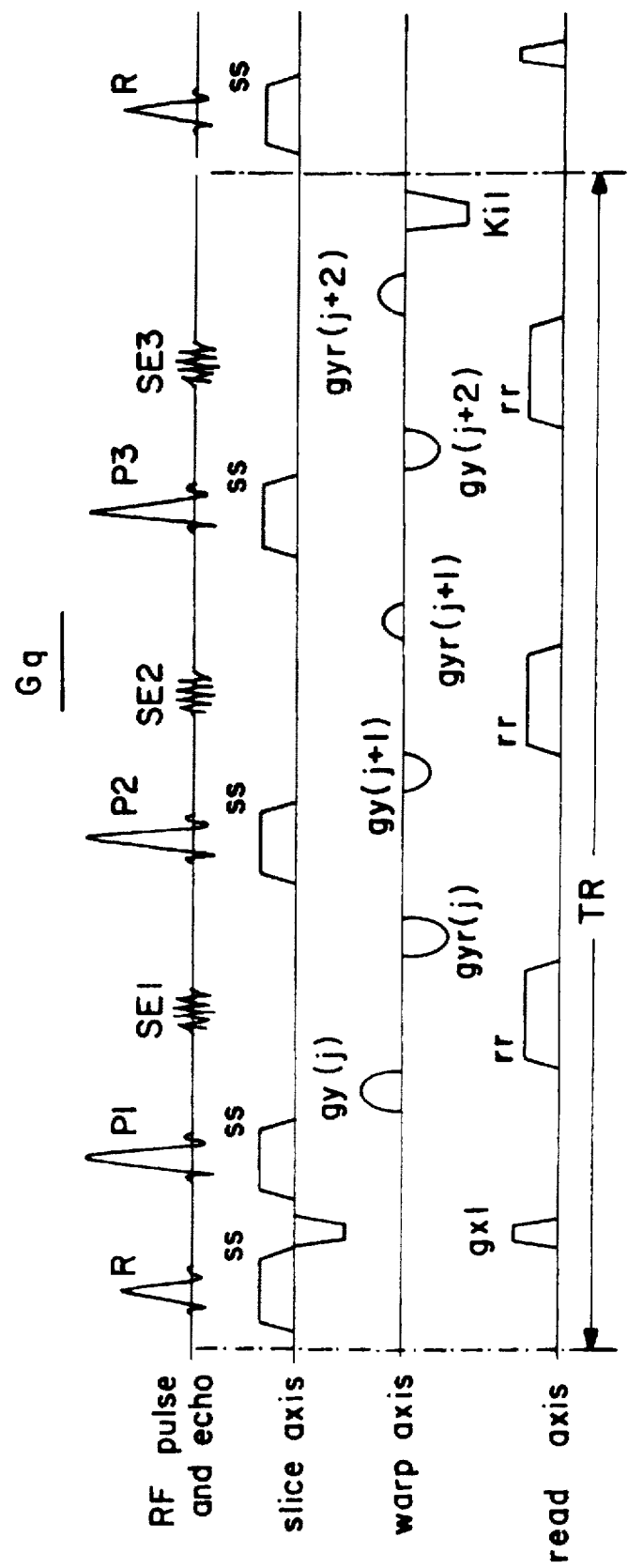
FIG. 23 is a view illustrating another example of the pulse sequence employed in the imaging data collecting process executed in the sixth embodiment.

FIGS. 22 and 23 respectively show pulse sequences employed in the sixth embodiment.

In the pulse sequence Gp shown in FIG. 22, an excitation pulse R and a slice gradient ss are applied. Next, a first inversion pulse P1 and a slice gradient ss are applied and a phase encode gradient gy(i) is applied to a warp axis. An NMR signal is next received from a first echo SE1 while a read gradient rr is being applied, followed by application of a rewind gradient gyr(i) of opposite polarity equal in time integral value to the encode gradient gy(i) to a warp axis. Next, a second inversion pulse P2 and a slice gradient ss are applied and an encode gradient gy(i+1) is applied to the warp axis. Further, the NMR signal is received from a second echo SE2 while another read gradient rr is being applied, followed by application of a rewind gradient gyr(i+1) of opposite polarity equal in time integral value to the encode gradient gy(i+1) to the warp axis. Next, a third inversion pulse P3 and a slice gradient ss are applied and an encode gradient gy(i+2) is applied to the warp axis. Further, the NMR signal is received from a third echo SE3 while a further read gradient rr is being applied, followed by application of a rewind gradient gyr(i+2) of opposite polarity equal in time integral value to the encode gradient gy(i+2) to the warp axis. Thus, a process from the transmission of the inversion pulses to the reception of the NMR signal is repeated M times (M=3 in the present embodiment). Next, a killer gradient Kil is applied. However, the polarity (positive in the present sequence) of the killer gradient Kil is made equal to that of the sum of the aforementioned phase encode gradients gy(i), gy(i+1) and gy(i+2).

Next, in the pulse sequence Gq shown in FIG. 23 a process from the transmission of an excitation pulse R to the application of a rewind gradient gyr(j+2) is performed in the same manner as shown in FIG. 22. A killer gradient Kil is next applied. However, the polarity (negative in the present sequence) of the killer gradient Kil is made equal to that of the sum of phase encode gradients gy(j), gy(j+1) and gy(j+2).

Thus, when the polarity of the killer gradient Kil is switched to the same polarity as that of the sum of the phase encode gradients corresponding to the M times, which are applied when the process from the transmission of the inversion or reversal RF pulse to the reception of the NMR signal is repeated M times, the influence of the eddy currents or residual magnetization caused by the phase encode gradient can be canceled by the killer gradient Kil. It is therefore possible to prevent the quality of an image from being degraded by the eddy current or residual magnetization caused by the phase encode gradient.

[Seventh embodiment]

Figure 24:
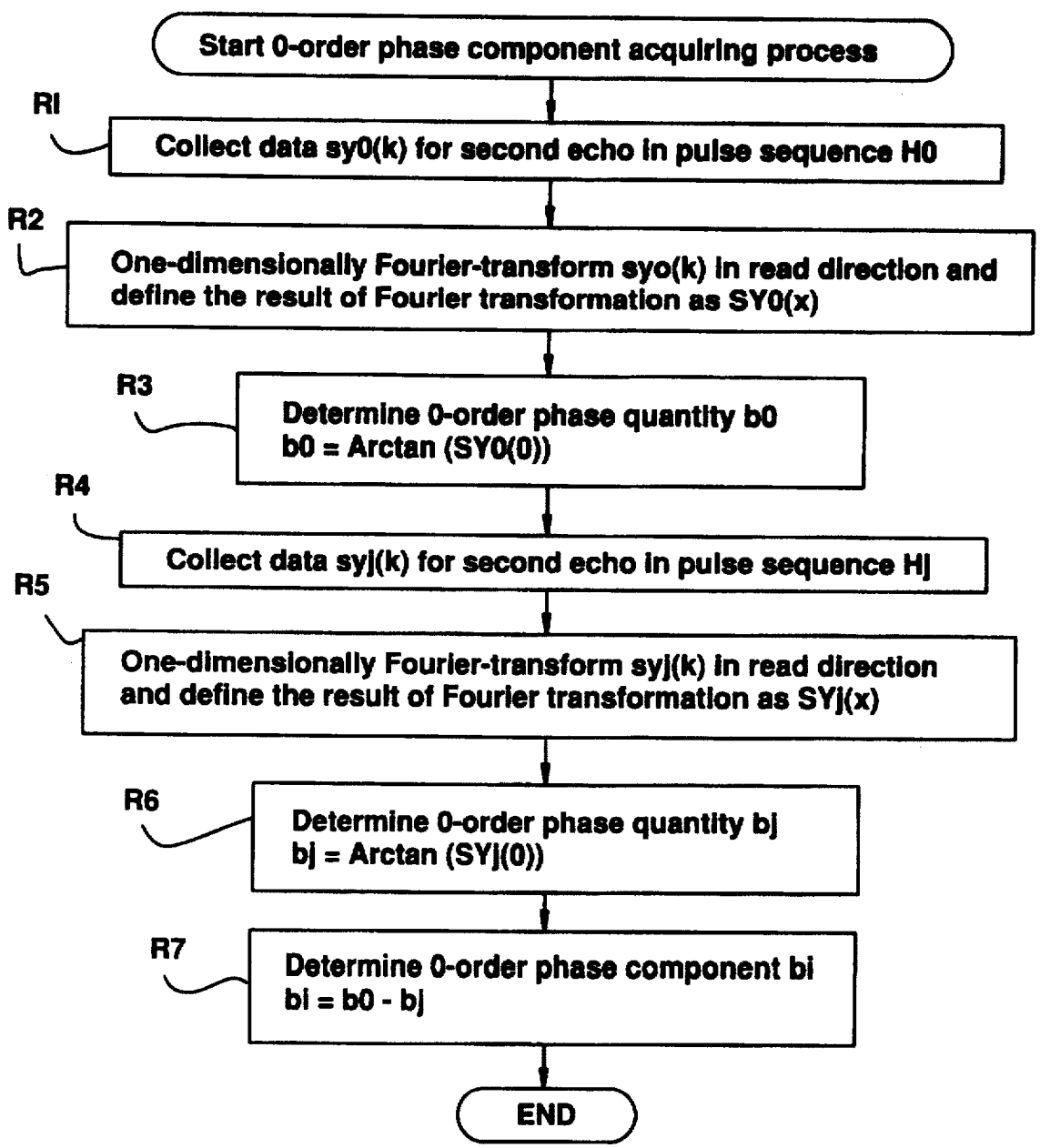
FIG. 24 is a flowchart for describing a 0-order phase component acquiring process employed in a seventh embodiment.

FIG. 24 is a flowchart for describing a 0-order phase component acquiring process employed in the MRI apparatus 100.

Figure 25:
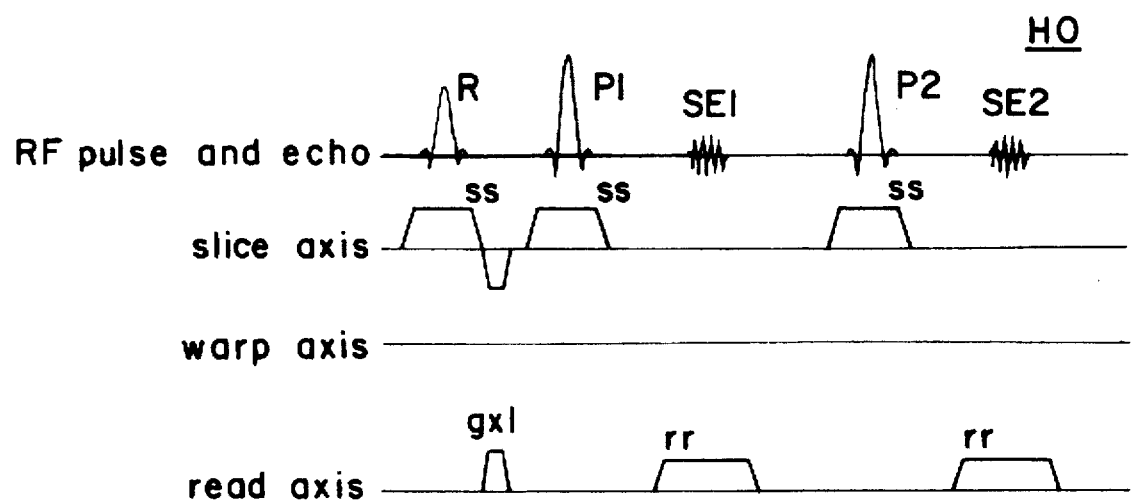
FIG. 25 is a view illustrating one example of a pulse sequence employed in the 0-order phase component acquiring process shown in FIG. 24.

At Step R1, as shown in FIG. 25, data sy0(k) associated with a second echo SE2 is collected in accordance with a pulse sequence H0 in which no phase encode gradient and rewind gradient are applied to a warp axis.

At Step R2, the data sy0(k) is one-dimensionally Fourier-transformed in a read direction and the result of Fourier transformation is defined as SY0(x).

At Step R3, a 0-order phase quantity b0=Arctan(SY0(0)) is determined. The 0-order phase quantity b0 shows a phase quantity at the gradient center at the time that no residual magnetization exists.

Figure 26:
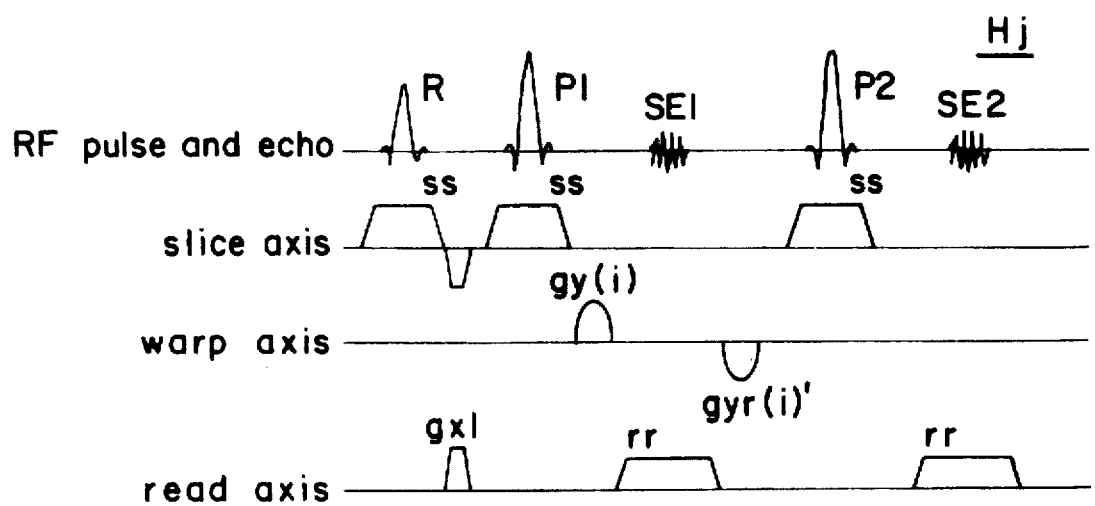
FIG. 26 is a view showing another example of the pulse sequence employed in the 0-order phase component acquiring process shown in FIG. 24.

At Step R4, as shown in FIG. 26, data syj(k) associated with a second echo SE2 is collected in accordance with a pulse sequence Hj in which a phase encode gradient gy(i) and a rewind gradient gyr(i)' are applied to a warp axis. Here, the rewind gradient gyr(i)' corresponds to a new rewind gradient gyr(i)' determined from a basic component gy(i) of the phase encode gradient determined by a scan parameter and a warp-axis correction component qi.

At Step R5, the data syj(k) is one-dimensionally Fourier-transformed in a read direction and the result of Fourier transformation is defined as SYj(x).

At Step R6, a 0-order phase quantity bj=Arctan{SYj(0)} is determined. The 0-order phase quantity bj shows a phase quantity at the gradient center at the time that the residual magnetization exists.

At Step R7, a 0-order phase component bi=b0−bj is determined.

If the 0-order phase component bi obtained in the above-described manner is used at Step S11 shown in FIG. 10, then a Ghost Artifact can be suppressed.

[Eighth embodiment]

The eighth embodiment is intended to prevent degradation of the quality of an image, which occurs due to the influence of eddy currents or residual magnetization caused by a phase encode gradient of a slice axis employed in a 3D high-speed SE method.

Figure 27:
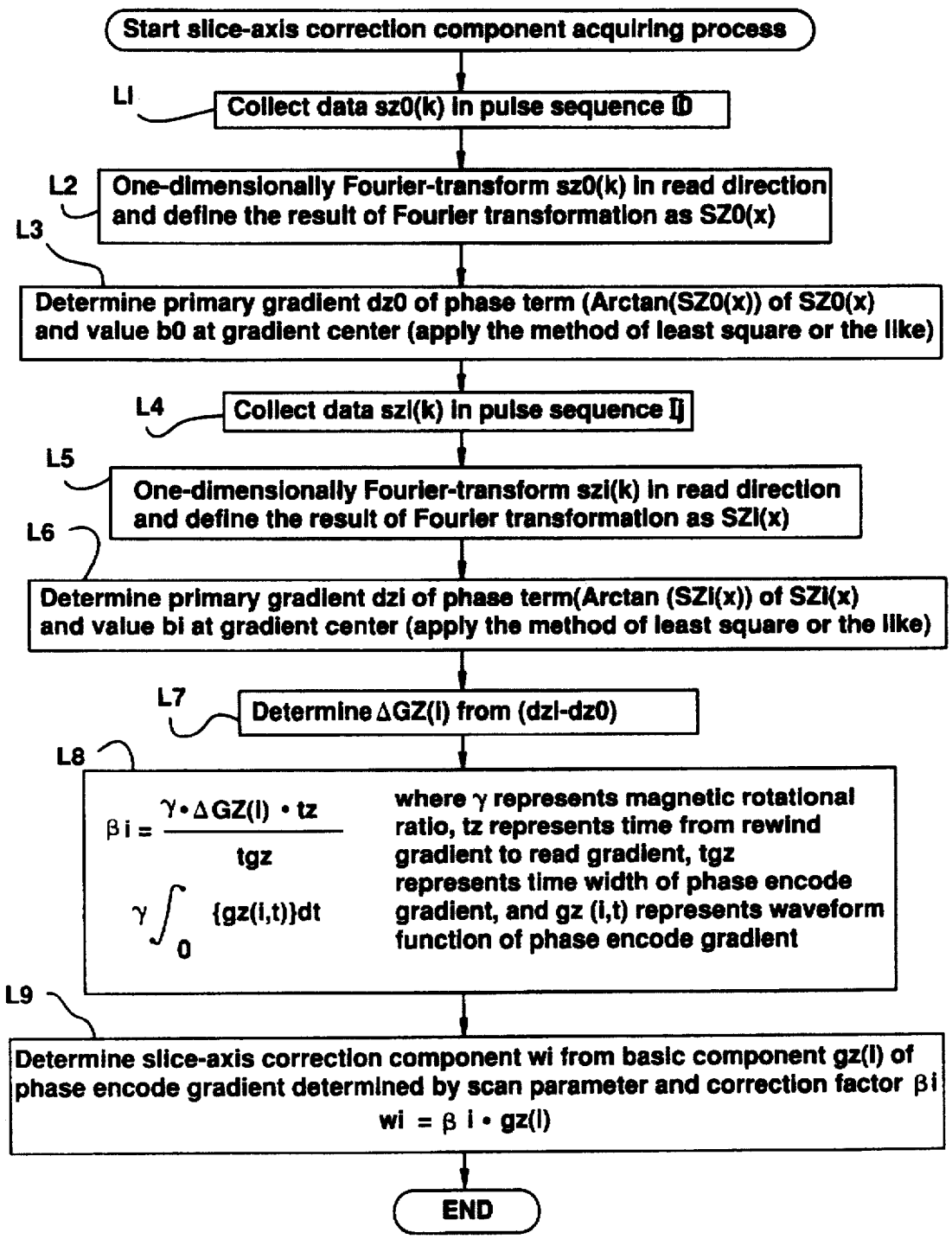
FIG. 27 is a flowchart for describing a slice-axis correction component acquiring process employed in an eighth embodiment.

FIG. 27 is a flowchart for describing a slice axis correction component acquiring process employed in the MRI apparatus 100.

Figure 28:
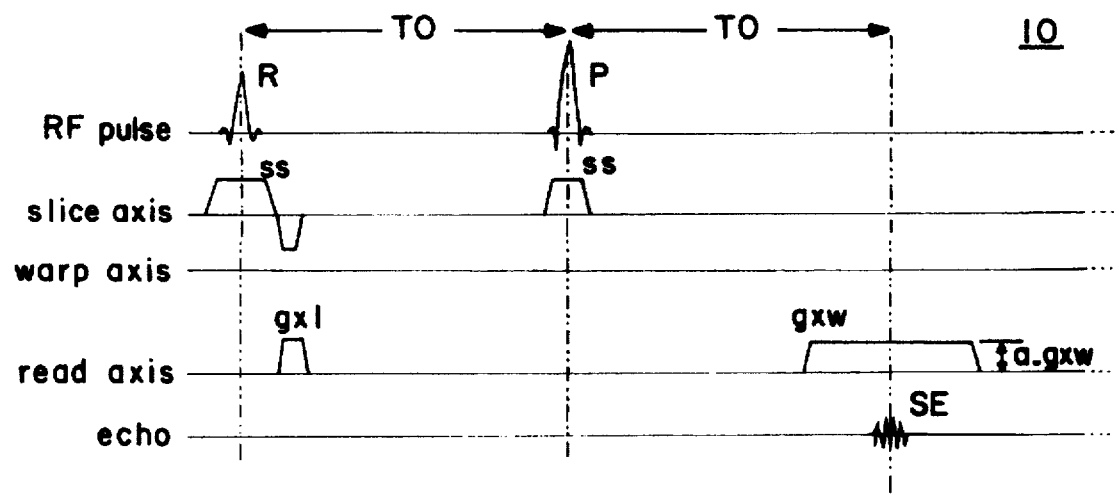
FIG. 28 is a view illustrating one example of a pulse sequence employed in the slice-axis correction component acquiring process shown in FIG. 27.

At Step L1, data sz0(k) is collected in accordance with a pulse sequence I0 shown in FIG. 28. In the pulse sequence I0, an excitation pulse R and a slice gradient ss are applied. Next, an inversion or reversal pulse P and a slice gradient ss are applied. Further, an NMR signal is received from an echo SE while a read gradient gxw is being applied, thereby collecting the data sz0(k). Incidentally, no phase encode gradient is applied to a warp axis and a slice axis.

At Step L2, the data sz0(k) is one-dimensionally Fourier-transformed in a read direction and the result of Fourier transformation is defined as SZ0(x).

At Step L3, a primary inclination or gradient dz0 of a phase term (Arctan(SZ0(x))) of the SZ0(x) is determined (by applying the method of least square or the like). Further, a phase quantity b0=Arctan(SZ0(0)) at the gradient center is determined. The phase quantity b0 corresponds to a phase quantity at the gradient center at the time that no residual magnetization exists.

Steps L1 through L3 referred to above show a process for acquiring influence or effect (a shift or displacement of an echo center of an echo signal SE) of eddy currents mainly caused by gradient magnetic fields gx1 and gxw.

Figure 29:
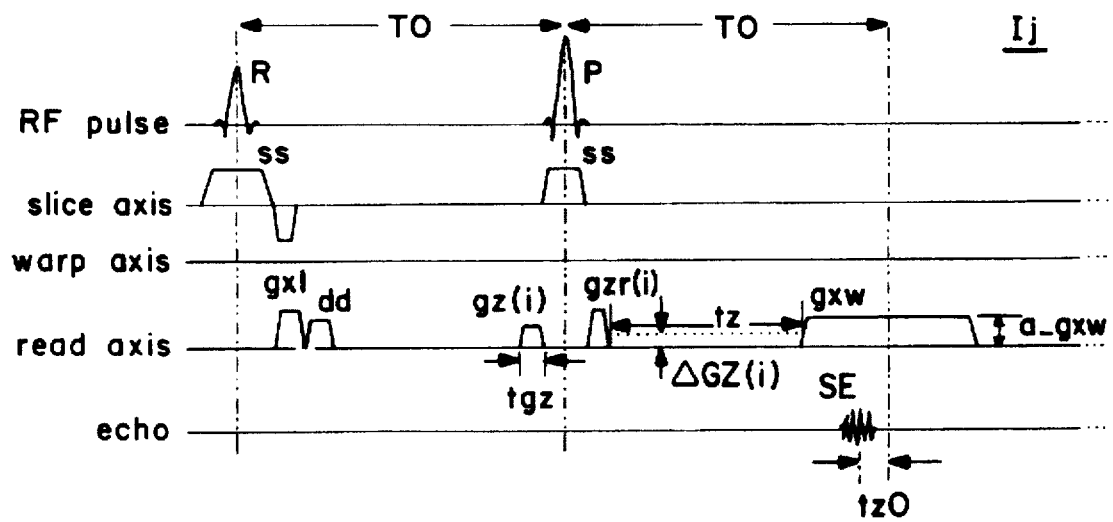
FIG. 29 is a view illustrating another example of the pulse sequence employed in the slice-axis correction component acquiring process shown in FIG. 27.

At Step L4, data szi(k) is collected in accordance with a pulse sequence Ij shown in FIG. 29. In the pulse sequence Ij, an excitation pulse R is applied and a slice gradient ss is applied to a slice axis. Next, a difference gradient dd corresponding to the difference between a phase encode gradient gz(i) and a rewind gradient gzr(i) on the slice axis, each being indicated by an encode number i determined by a scan parameter, is applied to a read axis. Further, an equivalent phase encode gradient gz(i) equal to the phase encode gradient gz(i) applied to the slice axis is applied to the read axis and an inversion or reversal pulse P and a slice gradient ss are applied. Thereafter, an equivalent rewind gradient gzr(i) equal to the rewind gradient gzr(i) on the slice axis is applied to the read axis. After a time t has elapsed, an NMR signal is received from an echo SE while a read gradient gxw is being applied, thereby to collect the data szi(k). Incidentally, no phase encode gradient is applied to a warp axis. Here, Step L4 may be repeated for all the encode numbers i (j=i in this case). As an alternative, however, Step L4 is repeated for an encode number i properly selected to shorten the time (j≠i in this case) and data about the unselected encode numbers may be determined by interpolation.

At Step L5, the data szi(k) is one-dimensionally Fourier-transformed in a read direction and the result of Fourier transformation is defined as SZi(x).

At Step L6, a primary gradient dzi of a phase term (Arctan(SZi(x))) of the result of Fourier transformation SZi(x) is determined (e.g. by application of the method of least square or the like). Further, a phase quantity bi=Arctan (SZi(0)) at the center of the gradient is determined and a difference (bi−b0) between the phase quantities bi and b0 is determined. The difference (bi−b0) corresponds to a 0-order phase component which is uniformly added without depending on the position under the influence of residual magnetization caused by the phase encode gradient gz(i).

Steps L4 through L6 referred to above correspond to a process for determining influence or effect of the residual magnetization mainly caused by the phase encode gradient gz(i).

At Step L7, a magnitude ΔGZ(i) of influence or effect of the eddy currents and residual magnetization caused by the phase encode gradient gz(i) is calculated from (dzi−dz0).

The term dzo indicates a phase cycle or rotation at the time that no phase encode gradient exists. On the other hand, the term dzi indicates a phase cycle or rotation at the time that the phase encode gradient gz(i) exists. Since the phase encode gradient gz(i) is originally canceled by the rewind gradient gzr(i), (dzi−dz0) should have been equal to 0. Thus, if (dzi−dz0)≠0, then the magnitude of the difference therebetween represents the magnitude of the influence of the eddy currents and residual magnetization caused by the phase encode gradient gz(i). Accordingly, ΔGZ(i) corresponding to the magnitude of the influence of the eddy currents and residual magnetization caused by the phase encode gradient gz(i) can be calculated from (dzi−dz0).

Namely, when the amplitude of a read gradient gxw is regarded as a_gxw and a shift time or the echo center by the influence of the eddy currents and residual magnetization caused by the phase encode gradient gz(i) is regarded as tz0, the following relation is obtained:

$\gamma \cdot \Delta GZ(i) \cdot tz = \gamma \cdot a\_gxw \cdot tz0$ (where $\gamma$ is a magnetic rotational ratio.)

Thus, the following equation is established:

$$\Delta GZ(i) = a\_gxw \cdot tz0 / tz$$

At Step L8, a correction factor $\beta i$ (corresponding to the magnitude of influence of eddy currents and residual magnetization per unit phase encode quantity) is determined in accordance with the following equation:

$$\beta i = \gamma \cdot \Delta GZ(i) \cdot tz / \gamma \int_0^{tgy} \{gz(i,t)\} dt \quad (2)$$

where $\gamma$ represents a magnetic rotational ratio, tz represents a time from a crusher gradient to a read gradient, tgz represents a time width of the crusher gradient, and gz(i,t) represents a waveform function of the crusher gradient.

At Step L9, a slice-axis correction component wi is determined from a fundamental or basic component gz(i) of the phase encode gradient determined by a scan parameter and the correction factor $\beta i$:

$$wi = \beta i \cdot gz(i)$$

Figure 30:
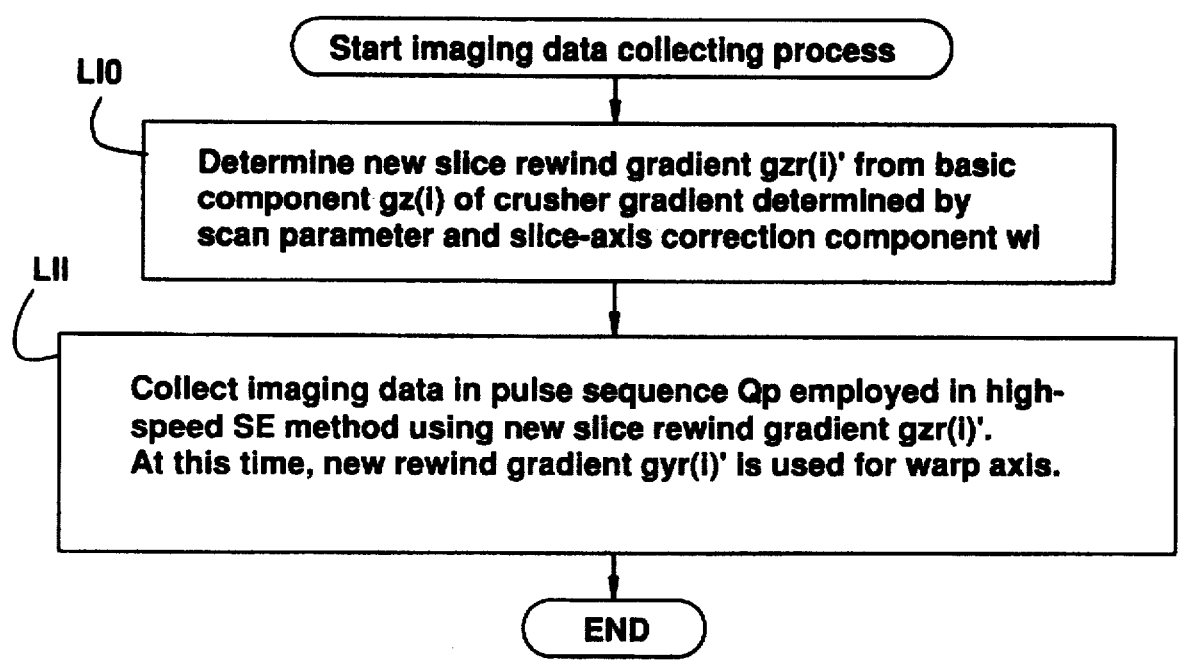
FIG. 30 is a flowchart for describing an imaging data collecting process employed in the eighth embodiment.

FIG. 30 is a flowchart for describing an imaging data collecting process.

At Step L10, a new rewind gradient gzr(i)' is determined from the basic component gz(i) of the phase encode gradient determined by the scan parameter and the slice-axis correction component wi:

$$gzr(i)' = gz(i) + wi$$

Figure 31:
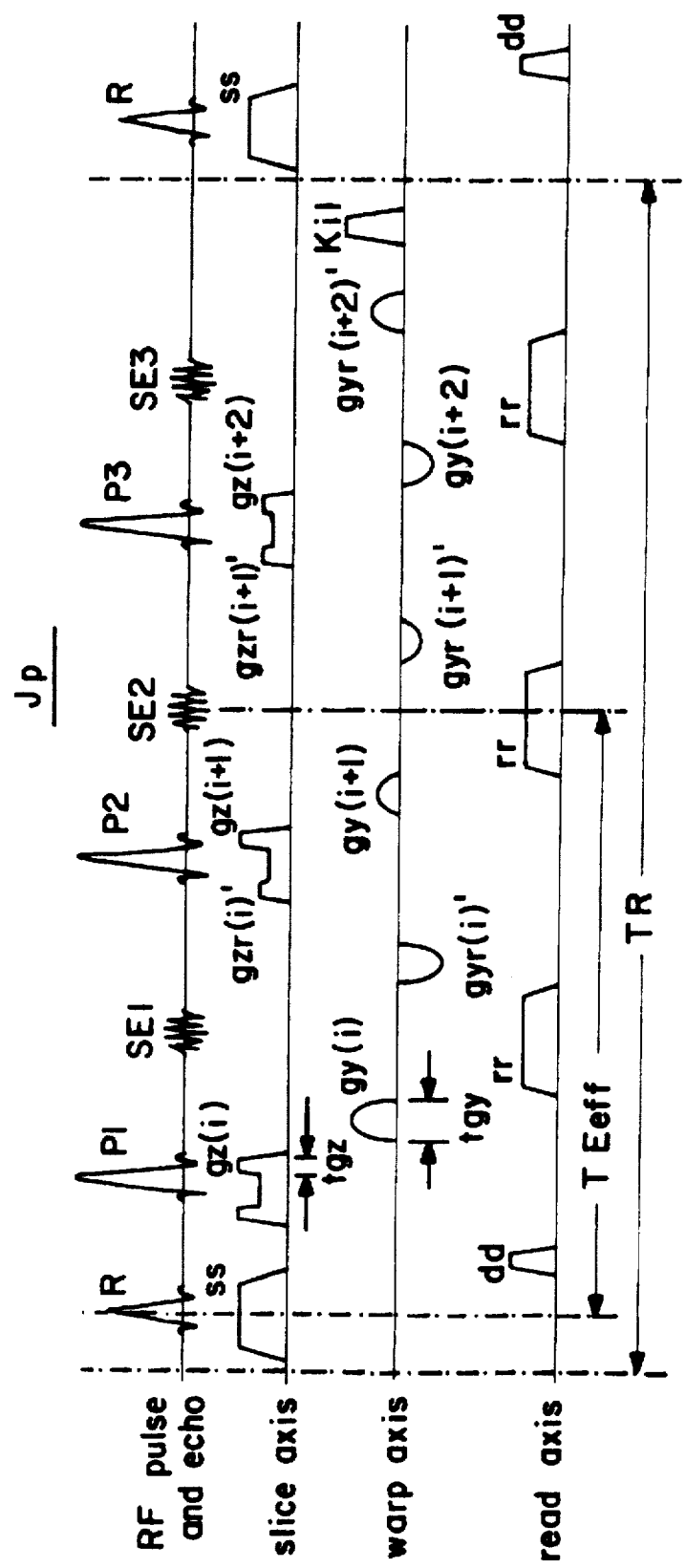
FIG. 31 is a view illustrating one example of a pulse sequence employed in the imaging data collecting process shown in FIG. 30.

At Step L11, imaging data are collected in accordance with a pulse sequence Jp employed in a 3D high-speed SE method using the new rewind gradient gzr(i)' shown in FIG. 31 on the slice axis. At this time, the aforementioned new rewind gradient gyr(i)' on the warp axis, which is employed in the first embodiment, may preferably be used simultaneously. Further, the phase detected by the phase detector 12 is adjusted or the corresponding transmission phases of inversion or reversal pulses P1, P2 and P3 are adjusted so as to cancel the difference in phase quantity (bi−b0).

Incidentally, an auxiliary rewind gradient and an auxiliary phase encode gradient on a slice axis may be used in the same manner as described with reference to FIGS. 7 through 9.

If imaging is performed using the imaging data collected in the above-described manner, it is then possible to prevent the quality of an image from being degraded under the influence of the eddy currents and residual magnetization caused by the phase encode gradient on the slice axis.

According to the MRI apparatus of the present invention, the quality of the image can be prevented from being degraded by the eddy currents or residual magnetization caused by the phase encode gradient. The MRI apparatus using the permanent magnet is particularly useful in improvements in the quality of an image.

Many widely different embodiments of the present invention may be constructed without departing from the spirit and scope of the present invention. It should be understood that the present invention is not limited to the specific embodiments described in the specifications, except as defined in the appended claims.

What is claimed is:

1. An MRI apparatus comprising:

RF pulse transmitting means for transmitting an RF pulse;

gradient magnetic field applying means for applying a phase encode gradient to a warp axis; and NMR signal receiving means for receiving an NMR signal; wherein said gradient magnetic field applying means comprises:
means for applying a rewind gradient to said warp axis after said RF pulse is transmitted, said phase encode gradient is applied, and said NMR signal is received, and means for obtaining said rewind gradient by adding a warp correction axis component or equivalent thereof to a basic component of said phase encode gradient or equivalent thereof, said rewind gradient being of opposite polarity and equal in time integral value to said phase encode gradient so that adverse influence of eddy currents or residual magnetization by said phase encode gradient is corrected.

2. An MRI apparatus comprising:

RF pulse transmitting means for transmitting an RF pulse;

gradient magnetic field applying means for applying a phase encode gradient to a warp axis; and NMR signal receiving means for receiving an NMR signal; wherein said gradient magnetic field applying means comprises:
means for obtaining said phase encode gradient by adding a warp correction component or equivalent thereof to a basic component of said phase encode gradient or equivalent thereof, to correct for adverse influence of eddy currents or residual magnetization caused by said phase encode gradient being applied to said warp axis, said phase encode gradient being determined by a scan parameter; and means for applying to said warp axis a rewind gradient of opposite polarity and equal in time integral value to said phase encode gradient after said NMR signal is received.

3. The apparatus of claim 1 or 2, wherein said gradient magnetic field applying means applies a read gradient to said read axis; and further comprising:

first phase information acquiring means for receiving said NMR signal and for obtaining a first phase information therefrom, while said RF pulse is being applied and while said read gradient is being applied to said read axis without said phase encode being applied to said warp axis;

second phase information acquiring means for receiving said NMR signal and for obtaining a second phase information therefrom, while said RF pulse is being transmitted, and while said gradient magnetic field applying means applies to the read axis a phase encode gradient or equivalent thereof which is equal in time integral value to said phase encode gradient, applies to the read axis an equivalent rewind gradient opposite in polarity and equal in time integral value to said equivalent phase encode gradient, without applying said phase encode gradient to said warp axis, and then applies a read gradient to said read axis; and warp axis correction component calculating means for determining a warp axis correction component from said first phase information and from said second phase information.

4. The apparatus of claim 1 or 2, wherein said gradient magnetic field applying means comprises means for applying a read gradient to said read axis; and further comprising:

present existing phase information acquiring means for receiving said NMR signal and for obtaining present existing phase information therefrom, while said RF pulse is being transmitted, while said phase encode gradient is being applied to said warp axis, and while said read gradient is being applied to said read axis;

ideal phase information acquiring means for receiving said NMR signal and for obtaining ideal phase information therefrom, while said RF pulse is being transmitted, while said phase encode gradient is being applied to said warp axis, and while said read gradient is being applied to said read axis, said phase encode gradient having a time width which is enlarged and an amplitude which is reduced; and warp axis correction component calculating means for determining a warp axis correction component from said present existing phase information and said ideal phase information.

5. An MRI apparatus comprising:

NMR signal receiving means for receiving an NMR signal;

RF pulse transmitting means for transmitting an excitation RF pulse and an inversion RF pulse; and gradient magnetic field applying means for applying a phase encode gradient to a warp axis, for applying a read gradient to a read axis, and for applying a killer gradient M times after said inversion RF pulse is transmitted and said NMR signal is received, and wherein said excitation RF pulse and said killer gradient are applied N times, thereby to collect NMR signals which are phase encoded M×N times; and said gradient magnetic field applying means comprises means for switching the polarity of said killer gradient to be the same as that of the sum of the phase encode gradient.

6. An MRI apparatus comprising:

RF pulse transmitting means for transmitting an excitation pulse and an inversion RF pulse;

gradient magnetic field applying means for applying a phase encode gradient to a warp axis alone or to a warp axis and a slice axis concurrently, and for thereafter applying a read gradient to a read axis;

NMR signal receiving means for receiving an NMR signal; and means for changing a transmission mode of the inversion RF pulse or changing a receiving mode of the NMR signal receiving means so as to suppress 0-order phase components produced by residual magnetization caused by the phase encode gradient.

7. The apparatus of claim 6, wherein said gradient magnetic filed applying means comprises means for applying an equivalent phase encode gradient to a read axis which is equal in time integral value to the phase encode gradient, and means for applying an equivalent rewind gradient opposite in polarity and equal in time integral value to the equivalent phase encode gradient to said read axis and to said slice axis, without applying said phase encode gradient to said warp axis; and further comprising 0-order phase component acquiring means for receiving an NMR signal and for obtaining phase information therefrom and for determining said 0-order phase component from said phase information.

8. The apparatus of claim 6, wherein said NMR signal receiving means comprises means for obtaining a first NMR signal when said phase encode gradient and a rewind gradient are applied to said warp axis, and means for obtaining a second NMR signal when said phase encode gradient and said rewind gradient are not applied to said warp axis; and further comprising 0-order phase component acquiring means for obtaining an 0-order phase component from said first and second NMR signals.

9. An MRI apparatus comprising:

RF pulse transmitting means for applying an excitation pulse and an inversion pulse;

gradient magnetic field applying means for applying a phase encode gradient to a slice axis; and NMR signal receiving means for receiving an NMR signal; wherein said gradient magnetic field applying means comprises:
  means for repeatedly applying a rewind gradient or equivalent thereof to said slice axis by a number of encodings in a slice axis direction,
  means for obtaining said rewind gradient by adding a slice axis correction component for correcting adverse influences of eddy currents or residual magnetization caused by said phase encode gradient, to a basic component of said phase encode gradient and of opposite polarity and equal in time integral value to said phase encode gradient, and
  means for obtaining said equivalent rewind gradient by adding the basic component and an auxiliary rewind gradient equivalent to the slice axis correction component.

10. The apparatus of claim 9, wherein said gradient magnetic field applying means comprises means for applying a read gradient to a read axis; and further comprising;

first phase information acquiring means for receiving an NMR signal and for obtaining a first phase information therefrom, while said RF pulse is being transmitted and while said gradient magnetic field applying means applies a read gradient to the read axis without applying the phase encode gradient to the slice axis;

second phase information acquiring means for receiving an NMR signal and for obtaining a second phase information therefrom, while said RF pulse is being transmitted, and while said gradient magnetic field applying means applies to said read axis a difference gradient which is equivalent to a difference between the phase encode gradient and a basic component of a subsequent rewind gradient, and applies to said read axis without applying said phase encode gradient to said slice axis, an equivalent phase encode gradient which is equal in time integral value to the phase encode gradient and an equivalent rewind gradient equal in time integral value to a basic component of said rewind gradient, and then applies a read gradient to said read axis; and slice axis correction component calculating means for determining a slice axis correction component from said first and second information.

* * * * *